(12) United States Patent
Shi et al.

(10) Patent No.: US 7,398,508 B2
(45) Date of Patent: Jul. 8, 2008

(54) EIGEN DECOMPOSITION BASED OPC MODEL

(75) Inventors: Xuelong Shi, San Jose, CA (US); Robert J. Socha, Campbell, CA (US); Thomas Laidig, Point Richmond, CA (US); Douglas Van Den Broeke, Sunnyvale, CA (US)

(73) Assignee: ASML Masktooks B.V., Veldhoven (NL)

( * ) Notice: Subject to any disclaimer, the term of this patent is extended or adjusted under 35 U.S.C. 154(b) by 166 days.

(21) Appl. No.: 10/981,750

(22) Filed: Nov. 5, 2004

(65) Prior Publication Data

US 2005/0149902 A1    Jul. 7, 2005

Related U.S. Application Data

(60) Provisional application No. 60/605,716, filed on Aug. 31, 2004, provisional application No. 60/517,083, filed on Nov. 5, 2003.

(51) Int. Cl.
    *G06F 17/50* (2006.01)
(52) U.S. Cl. .......................................... 716/19; 716/21
(58) Field of Classification Search ............. 716/19–21; 430/5, 22; 382/144, 140–141; 378/35; 703/5
See application file for complete search history.

(56) References Cited

U.S. PATENT DOCUMENTS

| | | | |
|---|---|---|---|
| 4,894,790 A | 1/1990 | Yotsuya et al. | |
| 5,097,138 A | 3/1992 | Wakabayashi et al. | |
| 5,307,296 A | 4/1994 | Uchida et al. | |
| 5,307,421 A | 4/1994 | Darboux et al. | |
| 5,319,564 A | 6/1994 | Smayling et al. | |
| 5,416,729 A | 5/1995 | Leon et al. | |

(Continued)

FOREIGN PATENT DOCUMENTS

EP        1 329 771        7/2003

(Continued)

OTHER PUBLICATIONS

Pati Y.C, et al. "Exploiting Structure in Fast Aerial Image Computation for Integrated Circuit Patterns." IEEE Transactions on Semiconductor Manufacturing, Feb. 1997, IEEE, USA, vol. 10, No. 1, pp. 62-74, XP002256517.

(Continued)

*Primary Examiner*—Paul Dinh
(74) *Attorney, Agent, or Firm*—McDermott Will & Emery LLP

(57) ABSTRACT

Model OPC is developed based on eigen decomposition of an aerial image expected to be produced by a mask pattern on a surface of a resist. With the eigen decomposition method the aerial image intensity distribution around a point (x, y) is accurately described in the model. A scalar approach may be used in the eigen decomposition model which treats the light wave through the mask as a scalar quantity. A eigen decomposition alternatively may use a vector approach which utilizes a vector to describe the light wave and the pupil function. A predicted SPIF may be generated from the aerial image which may be used to verify the mask modeling process by comparing the predicted SPIF to an experimentally determined SPIF. The model OPC, once calibrated, may be used to evaluate performance of a mask and refine features of the mask.

22 Claims, 16 Drawing Sheets

U.S. PATENT DOCUMENTS

| | | | |
|---|---|---|---|
| 5,621,652 | A | 4/1997 | Eakin |
| 5,795,688 | A | 8/1998 | Burdorf et al. |
| 5,825,647 | A | 10/1998 | Tsudaka |
| 5,966,312 | A | 10/1999 | Chen |
| 6,081,659 | A | 6/2000 | Garza et al. |
| 6,223,139 | B1* | 4/2001 | Wong et al. .................... 703/5 |
| 6,289,499 | B1 | 9/2001 | Rieger et al. |
| 2002/0062206 | A1* | 5/2002 | Liebchen ...................... 703/6 |
| 2003/0126581 | A1 | 7/2003 | Pang et al . |
| 2004/0139418 | A1* | 7/2004 | Shi et al. .................... 716/19 |
| 2004/0142251 | A1* | 7/2004 | Hsu et al. .................... 430/5 |
| 2005/0015233 | A1* | 1/2005 | Gordon ...................... 703/13 |
| 2005/0120327 | A1* | 6/2005 | Ye et al. ...................... 716/20 |
| 2005/0142470 | A1* | 6/2005 | Socha et al. .................. 716/19 |
| 2005/0149900 | A1* | 7/2005 | Laidig ........................ 716/19 |

FOREIGN PATENT DOCUMENTS

| | | |
|---|---|---|
| EP | 1 439 420 A1 | 7/2004 |

OTHER PUBLICATIONS

Mack C A . et al "Metrology, Inspection, and Process Control for Microlithography XV." Santa Clara CA, Feb. 26, 2001-Mar. 1, 2001, vol. 4344, pp. 377-384, XP 008022568.

Cobb N, et al. "Mathematical and CAD Framework for Proximity Correction." Optical Microlithography IX, Santa Clara, CA, Mar. 13-15, 1996, vol. 2726, pp. 208-222, XP008022569.

Yeung M.S., et al. "Extension of the Hopkins theory of partially coherent imaging to include thin-film interference effects" 452/SPIE vol. 1927 Optical/Laser Microlithography VI (1993).

Randall J. et al. "Variable Threshold Resist Models for Lithography Simulation" XP008001832, PD Mar. 17, 1999, pp. 176-182.

Crisalle O.D., et al.. "A Comparison of the Optical Projection Lithography Simulators in Sample and Prolith" IEEE Translantions on Semiconductior MA, vol. 5, No. 1. Feb. 1992.

Gopalarao K. S. V. et al., "An Integrated Technology CAD System for Process and Device Designers", IEEE Transactions on Very Lare Scale Integration (VLSI) Systems, vol. 1, No. 4, Dec. 1993.

Neubauer, G. et al., "Imaging VLSI Cross Sections by Atomic Force Microscopy", CH3084-1/92/0000-0299$0.100 @ 1992 IEEE/IRPS.

Rodgers M., "Application of the Atomic Force Microscope to Integrated Circuit Reliability and Failure Analysis", CH2974-4/91/0000-0250$01.00 @ 1991 IEEE/IRPS.

Qian Q.E. et al., "A New Scalar Planewave Model for High NA Lithography Simulations", TH0640-3/94/0000-0045 $3.00 @1994 IEEE.

Barouch E. et al., "Modeling Process Latitude in UV Projection Lithography", vol. 12, No. 10, Oct. 1991.

Beacham, J., et al., "Applications of an Atomic Force Metrology System in Semiconductor Manufacturing", 0-8194-1160-4/93/$6.00, SPIE vol. 1926 / 311.

Peters L. "AFMs: What Will Their Role Be?" 62/Semiconductor International Aug. 1993.

"Prolith/2 User's Manual", Version 3.0 for the Macintosh, Finie Technologies, Jul. 1993.

* cited by examiner

3rd Eigen Function

4th Eigen Function

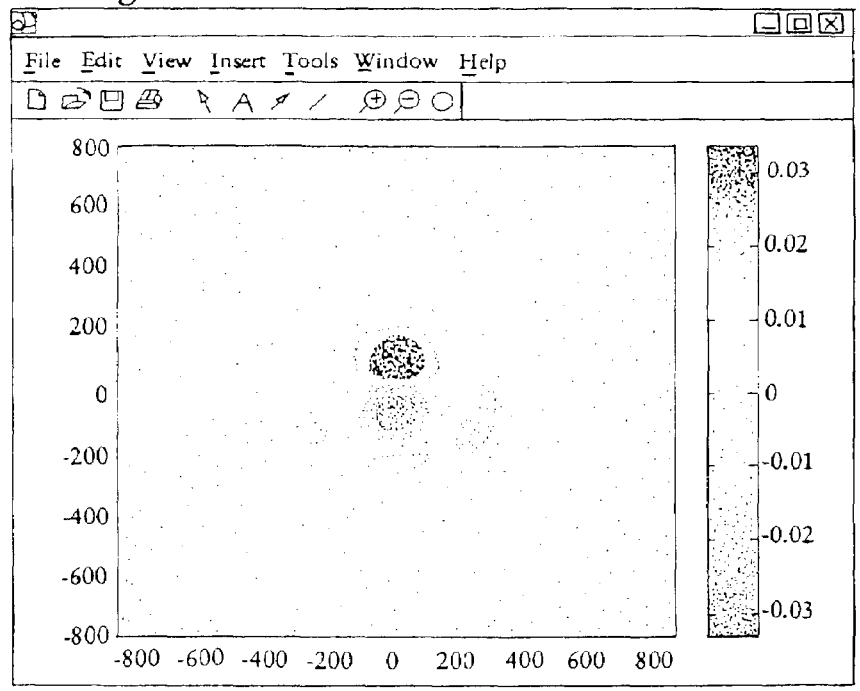
Fig. 10C — 3rd Eigen Function
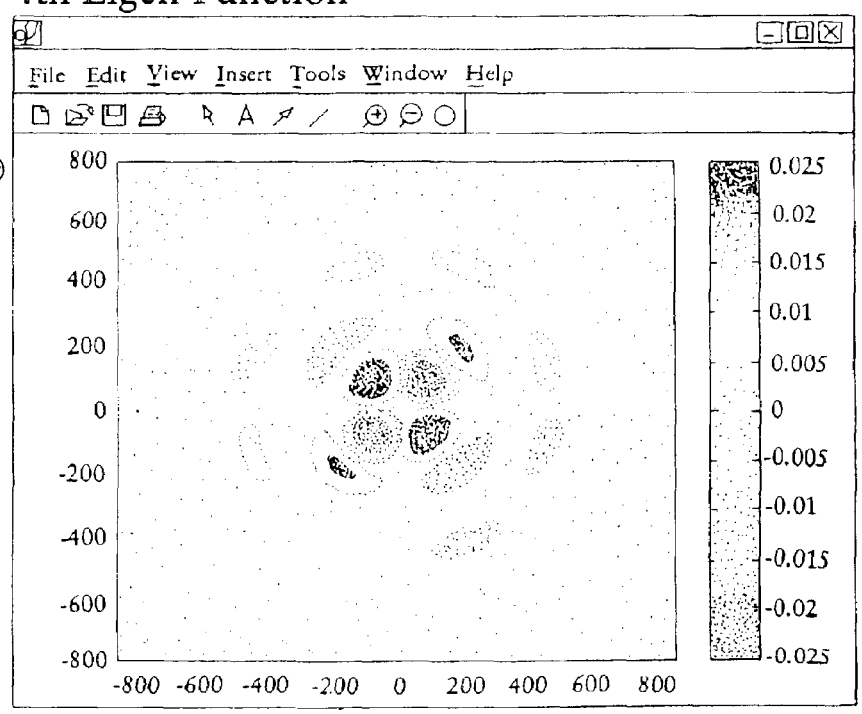
Fig. 10D — 4th Eigen Function

EIGEN DECOMPOSITION BASED OPC MODEL

This application claims the benefit of provisional application 60/517,083, filed on Nov. 5, 2003 titled MODEL OPC IMPLEMENTATION WITH GENERALIZED ILLUMINATION and also claims the benefit of provisional application 60/605,716 filed on Aug. 31, 2004, titled VECTOR EIGEN DECOMPOSITION BASED OPC MODEL, each of which are herein incorporated by reference in their entirety.

FIELD OF THE INVENTION

The field of the invention relates generally to a method, apparatus and program product for preventing optical proximity correction to target mask patterns. The present invention more particularly relates to a method, apparatus and program product for generating a model of the imaging process which can be utilized to simulate the aerial image of the imaging process for any given input mask pattern.

BACKGROUND

Lithographic apparatus can be used, for example, in the manufacture of integrated circuits (ICs). In such a case, the photolithographic mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book Microchip Fabrication: A Practical Guide to Semiconductor Processing, Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process is often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

As the technology advances in the semiconductor industry, the dimensions on a circuit have scaled down dramatically, which leads to significant deterioration in image quality and photolithography process robutsness. From a physical point of view, the ratio of the exposure wavelength over the numerical aperture of the imaging system needs to be reduced in order to improve the image fidelity. To enhance semiconductor device performance and to increase the chip functionality, the minimum feature size and minimum pitch on the chip designs have been reduced progressively in a very aggressive fashion. To meet the challenges, the semiconductor industry has developed exposure tools with shorter wavelengths and higher numerical apertures (NA). The continuous advances in photolithography exposure tools along this line have proven very successful until now. To further shorten the exposure wavelength beyond 193 nm or to further increase the numerical aperture beyond 0.9 presents enormous obstacles both economically and technically. To overcome the limitations imposed by the current photolithography exposure tool, the modification of mask data, which is commonly referred to as optical proximity correction (OPC), is gaining ever-increasing momentum in advanced photolithography. OPC usually consists of applying scattering bars (SBs), whose role is to enhance process latitude, and main feature biasing. The use of scatter bars is discussed in U.S. Pat. No. 5,242,770, herein incorporated by reference. Although scattering bar placement rules can be generated from optical imaging theory without taking the resist effect into account, the correct amount of biasing of the mask data at a given location can never be predicted accurately without considering the effect of the resist.

The original implementation of OPC is rule based, the rule set for a given process can be developed either through experiments or through a combination of optical modeling and resist modeling. The rule set thus obtained is essentially a look-up table from which the placement position of SB, if it is permitted, and the amount of correction for the main feature can be readily found, provided that the neighboring environment around the edge to be corrected can be specified. The neighboring environment considered in the rule based OPC is one-dimensional and short ranged. This character leads to its simplicity in implementation, but it also intrinsically sets the limitation of its accuracy. For 130 nm technology and beyond, the inadequacy of rule based OPC becomes evident, and new methods of OPC that can overcome the shortcomings of the rule based OPC is needed. The new method, for example, should provide a way to specify the 2-dimensional environment around the correction point on a much larger spatial scale.

For features having a pitch, where there is no room to insert SB, a typical method of optical proximity correction (OPC) is to adjust the feature edges (or apply bias) so that the printed feature width is closer to the intended width. In order for the use of the sub-resolution features and/or feature biasing to be effective for minimizing optical proximity effects, an operator having a substantial amount of knowledge regarding mask design and the printing process, as well as a substantial amount of experience, is required to modify the mask design to include the subresolution features and/or the adjustment of feature edges (biasing) if the desired goal is to be obtained. Indeed, even when an experienced operator performs this task, it is often necessary to conduct a "trial and error" process in order to properly position the subresolution features to obtain the desired corrections. This trial and error process, which can entail repeated mask revisions followed by repeated simulations, can become both a time consuming and costly process.

Current implementation for mask data biasing is commonly based on some model that has been calibrated on a specific photolithography process. Such an approach is commonly referred as to model OPC. For example, correcting for optical proximity effects (OPE) often entails attempting to "calibrate" the printing process so as to compensate for the OPEs. Currently known techniques include "correlating" so-called calibration parameters to the OPC model, which requires performing a set of detailed SEM CD measurements at various feature sites. Regardless of the actual feature shape, these are 1-dimensional width measurements. The more measurement data collected, the better the precision of the calibration parameters. However, for a reliable model parameter calibration, it is not unusual to require more than several hundreds of CD measurements at various critical feature sites under different neighboring environments. These are labor intensive and time consuming work. Worse, how the measurement CDs were taken can often become operator dependent due to the experience level, which can obviously impact the parameter calibration negatively, thereby limiting the overall effectiveness of the technique.

There are several ways to develop and implement model OPC, such as disclosed by John P. Stirniman, Michael L. Rieger, SPIE, Vol. 2197, (1994), 294 and Nick Cobb, Avideh Zakhor, and Eugene Miloslavsky, SPIE, Vol. 2726, (1996), 208. However, these models are facing ever-increasing challenges in meeting the more stringent dimension control requirements in low k1 photolithography. Those models are also very likely to fail in working with the new advanced photolithography technologies, such as Chromeless Phase Lithography (CPL) in which the topography on the mask is rather significant, and Double Dipole Lithography (DDL) in which two masks and two exposures are needed. In addition to those concerns, advanced illuminations such as customer designed illuminators using diffractive optical elements (DOE), deviations of real illuminator profiles from theoretical top-hat illuminator profiles are all presenting enormous challenges to the current available models. To tackle the difficulties, a fundamentally different model, that has more solid physical and mathematical foundations, must be developed.

Various techniques exist to achieve illumination optimization for photolithography. Various mask optimization techniques also have been known. However, currently illumination optimization and mask optimization are not generally linked. U.S. Pat. No. 6,563,566 to Rosenbluth et al. discloses to perform illumination optimization and mask optimization through a series of calculations which attempt to linearize the optimization of the mask transmission. Rosenbluth discloses to maximize the minimum NILS (normalized image log slope) and to select various constraints to be used in the calculations. Rosenbluth also recognizes that the calculations may be limited relying on the symmetry of a mask. However, the linearization of the mask transmission used by Rosenbluth requires using several approximations in the calculations, instead of the actual imaging equations themselves, which produce errors in implementing a mask to form a desired image. The linearization of the mask transmission also requires the use of a significant number of variables, which requires significant computation time to perform the calculations. Accordingly, as logic feature sizes decrease, there is a need to provide mask implementations that precisely form a desired image with minimum computational time.

SUMMARY OF THE INVENTION

In order to solve the foregoing deficiencies of the prior art, the present invention relates to a method for modeling a photolithography process comprising the steps of: receiving parameters indicative of a mask layout and characteristics of an imaging system on which the mask layout is intended to be used; determining an aerial image intensity distribution expected to be produced on a resist by the mask layout by means of decomposing an aerial image into eigen functions of the optical imaging system. Since the optical imaging system acts as a low frequency pass filter, the aerial images from an optical imaging system are band-limited, i.e, their spatial frequencies are bounded. The effective degrees of freedom of such band-limited functions are finite, therefore, only a countable few basis functions are required to represent such a class of functions. The most effective basis functions are the eigen functions of the optical imaging system. By decomposing the aerial images onto the eigen functions at each point (x,y), a set of signals, $\{S_1, S_2, \ldots, S_N\}$, may be obtained from which a system pseudo intensity function (SPIF) can be constructed. The transformation from aerial images to their corresponding SPIFs are made through a function that contains a set of variables $\{S_1, S_2, \ldots, S_N\}$ and a set of parameters. The parameters are characteristic of the given imaging process to be utilized, and they have to be determined by the calibration procedure. During calibration, those parameters are automatically adjusted until the error between the modeled contours, that are obtained through thresholding the SPIFs at a constant value, and the experimental contours is minimal. In accordance with the method of the present invention, the contours of the imaged patterns may be determined using a constant threshold eigen decomposition model.

In accordance with the method of the present invention, the aerial image may be determined using a variable threshold eigen decomposition model.

Further, in accordance with the method of the present invention, the aerial image may be determined using a vector eigen decomposition model.

A method for modeling a photolithography process may comprise the steps of: receiving parameters indicative of the mask layout and characteristics of an imaging system on which the mask layout is intended to be used; determining an aerial image intensity distribution expected to be produced on a resist by the mask layout using eigen values of an aerial image expected to be produced based on the parameters; and determining a system pseudo intensity function (SPIF) based on the aerial image.

The method for modeling a photolithography process may further comprise the steps of: applying a constant threshold to the SPIF to generate contours; comparing the generated contours with expected contours; and adjusting weights of each term associated with each eigen function and generating a new SPIF if the generated contours are not within a predetermined tolerance of the expected contours.

In the method for modeling a photolithography process the steps of applying a constant threshold to the SPIF, comparing the generated contours and adjusting weights of each term associated with each eigen vector may be repeated a predetermined number of times or until the generated contours are within a predetermined tolerance of the expected contours.

In the method for modeling a photolithography process the constant threshold may be the same constant threshold for each SPIF, or may be a variable threshold which changes for each SPIF.

In the method for modeling a photolithography process, the step of determining an aerial image utilizes a vector characterization of a light wave.

In the method for modeling a photolithography process, the step of determining an aerial image utilizes a pupil function indicative of characteristics of the optical imaging system. The pupil function may be produced by the function:

$$K_{ij}(\alpha', \beta', z') = \sum_{k=x,y,z} \sqrt{\frac{\gamma}{\gamma'}} G_{ik}(\alpha', \beta', z') Q_{kj}(\alpha', \beta') e^{i\frac{2\pi}{\lambda}[W(\alpha',\beta')+\gamma'\Delta]}$$

where ($\alpha'$, $\beta'$) are angular coordinates in an exit pupil, $z'$ is a plane position in a resist relative to an air/resist interface, W ($\alpha'$, $\beta'$) is an aberration function, $\Delta$ is a defocus, N is a reduction factor in imaging system, $Q_{kj}$ ($\alpha'$, $\beta'$) accounts for the light polarization conversion from j component in the object space into k component into the image space, $G_{ik}(\alpha', \beta; z')$ accounts for the effect of light interference in the film stacks; and $\gamma$ and $\gamma'$ is the coherence given as follows:

$$\gamma' = \sqrt{1 - \alpha'^2 - \beta'^2}$$

$$\gamma = \sqrt{1 - (\alpha'^2 + \beta'^2)/N^2}.$$

In the method modeling a photolithography process, the step of determining the aerial image may include the step of determining a light intensity distribution at a plane z using eigen vector decomposition. The step of determining the aerial image may further include the step of determining a z-averaged light intensity distribution. The z-averaged light intensity distribution may be determined according to the function:

$$\langle \overline{I(x,y)} \rangle = \sum_{n=1} \chi_n \left| \int \int \Phi_n(f,g) \mathcal{F}(f,g) e^{2\pi i[fx+gy]} df dg \right|^2.$$

The present invention also relates to a system for modeling a photolithography process, the system comprises: an input for receiving parameters indicative of the mask layout and characteristics of an imaging system on which the mask layout is intended to be used; and a processor for executing instructions to determine an aerial image intensity distribution expected to be produced on a resist by the mask layout using eigen functions and eigen values of an aerial image expected to be produced based on the parameters and to convert the aerial image into SPIF.

In accordance with the system of the present invention, the contours from an aerial image may be determined using a constant threshold eigen decomposition model.

In accordance with the system of the present invention, the contours from an aerial image may be determined using a variable threshold eigen decomposition model.

Further in accordance with the system of the present invention, the aerial image may be determined using a vector eigen decomposition model.

The present invention also relates to a computer readable medium comprising instructions to cause a computer to perform a method for modeling a photolithography process (i.e., the resulting image formed on the wafer for the given mask and imaging process) comprising the steps of: receiving parameters indicative of the mask layout and characteristics of an imaging system on which the mask layout is intended to be used; determining an aerial image intensity distribution expected to be produced on a resist by the mask layout using eigen values of an aerial image expected to be produced based on the parameters; converting the aerial image into SPIF; determining if the SPIF is satisfactory; and combining successively determined aerial images with the aerial image until a satisfactory SPIF is achieved.

In accordance with the instructions on the computer readable medium of the present invention, the contours from an aerial image may be determined using a constant threshold eigen decomposition model.

In accordance with the instructions on the computer readable medium of the present invention, the contours from an aerial image may be determined using a variable threshold eigen decomposition model.

Further, in accordance with the instructions on the computer readable medium of the present invention, the aerial image may be determined using a vector eigen decomposition model.

A computer readable medium of the invention may contain instructions for a computer to perform comprising the steps of: receiving parameters indicative of the mask layout and characteristics of an imaging system on which the mask layout is intended to be used; determining an aerial image intensity distribution expected to be produced on a resist by the mask layout using eigen values of an aerial image expected to be produced based on the parameters; and determining a system pseudo intensity function (SPIF) based on the aerial image.

The computer readable medium for modeling a photolithography process may further comprise the steps of: applying a constant threshold to the SPIF to generate contours; comparing the generated contours with expected contours; and adjusting weights of each term associated with each eigen function and generating a new SPIF if the generated contours are not within a predetermined tolerance of the expected contours.

The eigen decomposition model of the present invention may be used with both a low NA scheme by utilizing an easy to implement thresholding scheme and a high NA scheme, which takes into account of the vector characteristic of light wave and the effects of film stacks above the wafer.

The eigen decomposition model for model OPC, may be implemented in software programs, such as ASML Masktool products. The present invention allows use of a constant threshold eigen decomposition model, a variable threshold eigen decomposition model, and any variants of such models.

Importantly, the present invention may be used to model almost any type of illumination, such as top-hat illuminator, or customer designed illuminators or experimental or modeled illuminator profiles. The eigenfunctions utilized in the present invention may be from a scalar pupil function or from a vector indicative of high NA pupil functions. The process of the present invention may be in the form of an algorithm that can generate eigenfunctions for a generalized illuminator, whether it is a customer designed illuminator or a real illuminator measured from experiment. The present invention can also be utilized with a high NA model. The eigen decompostion model developed can also work with new low k1 photolithography technologies, such as Chromeless Phase Lithography (CPL) and Dipole Double Lithography (DDL).

In accordance with the principles of the present invention, a systematic methodology can be utilized that converts the features in a CD SEM image into contours, with minimum human intervention.

BRIEF DESCRIPTION OF THE DRAWINGS

The accompanying drawings, which are incorporated in and form a part of the specification, together with the description serve to explain the principles of the invention. In the drawings.

DETAILED DESCRIPTION OF THE INVENTION

Disclosed is a method and system for model OPC that is based on eigen function decomposition (termed as Eigen Decomposition Model, or EDM). In the present invention, a partially coherent imaging system is preferably decomposed into a series of coherent imaging systems. The series of coherent imaging systems provide an effective and accurate way to describe the aerial image intensity distribution around a point of interest (x, y), which may be used to design an improved mask to improve the resolution of the desired image features in the photolithography process. For a precision model OPC on the mask pattern, we must ensure the illumination impact is well accounted for. For a tractable model OPC application, the present invention utilizes an eigen function decomposition approach to optimally approximate a partial coherence imaging system. The optimal approximation is used to generate a model which may be used to generate a SPIF function for each mask, which may be used by a computer simulation program to provide a simulation of the pattern produced by the mask on an exposed wafer having a resist. The model may be calibrated by comparing the simulated contours of the generated SPIF function with the experimental contours provided by a real mask illumination.

Partial coherence illumination has been the mainstream illumination mode in today's lithography process for IC manufacturing. In practice, the illumination coherency can be defined as the ratio of numerical apertures between the condenser lens and the objective lens. This ratio, commonly referred to as $\sigma$, ranges from 0 to 1. For coherent illumination, $\sigma$ is close to zero but for incoherent illumination, $\sigma \rightarrow 1$. The partial coherence illumination is thus defined as: $1 > \sigma > 0$. Physically, the illumination pupil, the lens pupil, and the mask are in the same conjugate plane, which is convenient for modeling the image formation mathematically. Thus, a coherent illumination imaging system can be relatively easily described in a straight-forward manner mathematically. However, it can become very complicated and computationally intractable if the same scheme is used to describe an imaging system with a partially coherent illumination.

For a precision model OPC on the mask pattern, it is necessary to ensure that the illumination impact is well accounted for. For a tractable model OPC application, the present invention utilizes an eigen function decomposition approach to optimally approximate a partial coherence imaging system.

Figure 2:
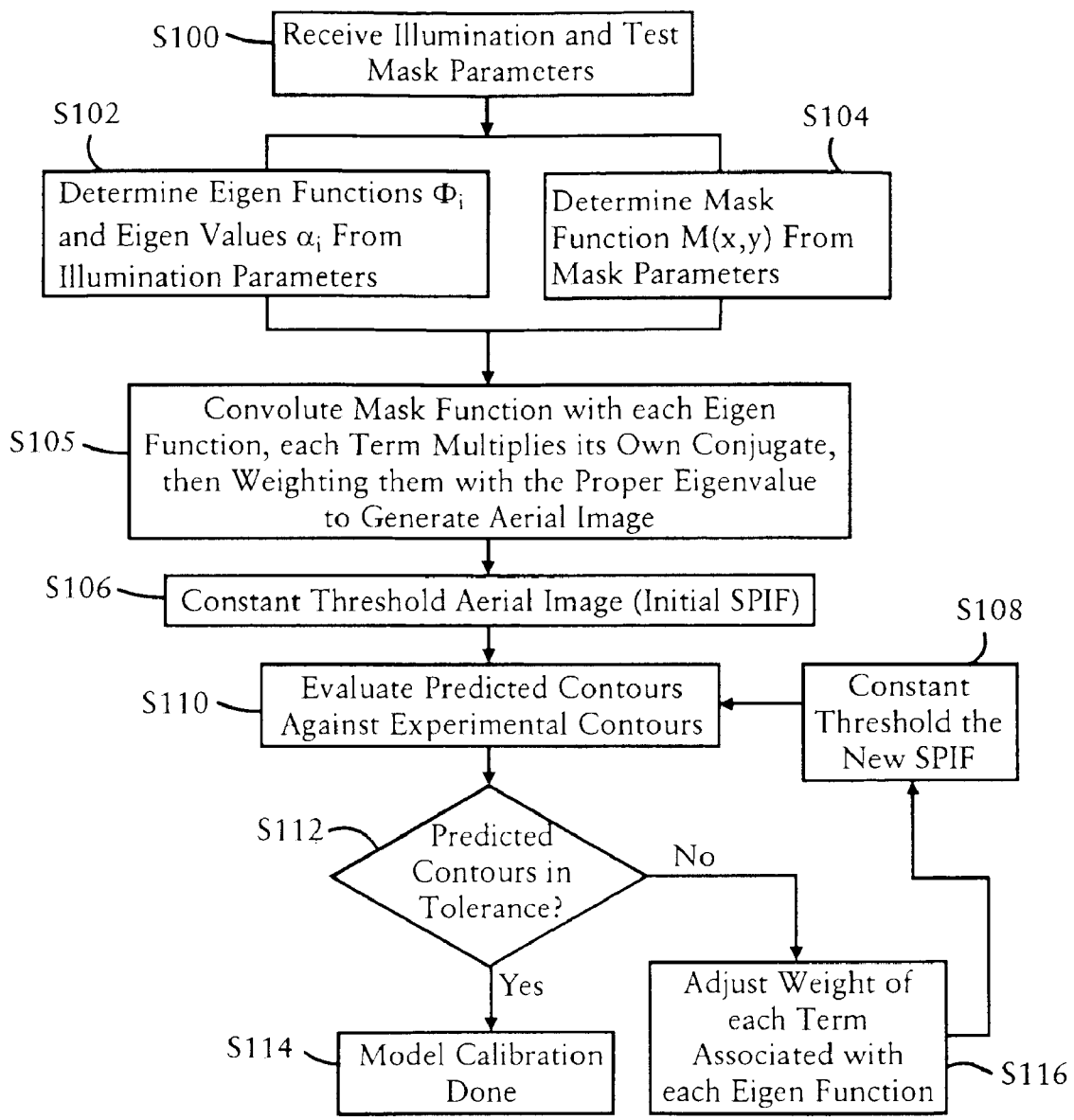
FIG. 2 illustrates an exemplary process for implementing the scalar eigen decomposition model of FIG. 1.

As illustrated in FIG. 2, the implementation of the eigen decomposition model involves several important steps, including: the generation of the eigenfunctions, the conversion of CD SEM images into well defined contours, and model calibration. Preferably, the implementation method can be used to derive an optimum set of model OPC eigen functions from a generalized illuminator. This technique is applicable whether the illuminator utilizes an ideal "top hat" profile, a customized radially asymmetric profile, or simply a "real" illuminator profile generated from modeling or is approximated using actual measurement. The eigen functions derived can be based on the best-matched illumination type; hence, it is more feasible to achieve a precision model OPC as compared to the use of model OPC method based on a theoretical illumination type.

Preferably, the EDM approach of the present invention is capable of working with advanced photolithography technologies, such as Chromeless Phase Lithography (CPL) in which the topography on the mask is rather significant, and Double Dipole Lithography (DDL) in which two masks and two exposures are needed. In addition, the EDM approach preferably can easily accommodate advanced illuminations such as customer designed illuminators using diffractive optical elements (DOE), or real illuminator profiles that deviate from theoretical top-hat illuminator profiles.

Unlike fully coherent illumination, when utilizing partial coherence illumination, for best imaging and OPC performance, it is possible to physically construct the illumination pupil to be either radially symmetrical or asymmetrical. Depending on the inherent optical design of the illumination source, the illumination pupil shape can be either one of uniform intensity (i.e., the "top-hat" pupil shape) or a continuously scaled intensity level (i.e., the "real" pupil shape). Moreover, it may also be desirable to intentionally design an asymmetrical illumination pupil with continuously scaled intensity illumination pupil (i.e., the "customized" pupil shape) to achieve the optimal printing performance. The principles of the invention can be used to derive a set of model OPC eigen functions for any generalized illumination pupil—such as top-hat, real, or customized. Thus, a powerful model OPC scheme can be implemented.

When using an optimized illumination in conjunction with phase-shifting mask (PSM), such as attenuated PSM (att-PSM) or chromeless phase lithography (CPL™) PSM, it has been demonstrated to greatly enhance printing resolution that is not possible to achieve using a conventional binary chrome mask. A very important enabling factor is the use of a precision model OPC scheme that can be utilized for the optimized illumination.

A. Constant Threshold Eigen Decomposition Model

Under partial coherent illumination conditions that are typically used in semiconductor manufacturing, the optical imaging system itself is nonlinear in character. The aerial image, i.e. the light intensity distribution at the image plane, from any given mask pattern, can be readily calculated rather accurately using well-known formulas in optics, see for example, H. H. Hopkins, Proc. Roy. Soc., A, 217 (1953), 408, herein incorporated by reference. The response of chemically amplified resist to light intensity and the subsequent resist development in solvent are all very nonlinear. The final developed pattern on a wafer can be viewed as binary, either with resist or without resist on top of the wafer substrate. The main function of the model is to provide a mathematical formula that can predict the binary image on the wafer from the mask pattern or the aerial image accurately. Stated mathematically, $$T(x,y) = \mathcal{F}\{M(x,y)\} \tag{1}$$

where $T(x,y)$ is the produced binary image on the wafer, and $M(x,y)$ is the input pattern on the mask. $\mathcal{F}$ represents the unknown functional form, which is the core of any model. In the constant threshold model, the binary image is achieved by cutting the aerial image of $M(x,y)$ using a constant threshold. The simplicity in obtaining the binary image using a constant threshold, however, is very attractive. There exists a mathematical theorem which states any binary function $T(x,y)$, whose value is either 0 or 1, can be obtained by thresholding a bandlimited continuous function $F(x,y)$ to any specified accuracy. The higher the required accuracy, the larger the required bandwidth of the function $F(x,y)$. Such a continuous function $F(x,y)$ is termed a system pseudo intensity function (SPIF) in the model of the present invention.

The transformation from the aerial image $I(x,y)$, which can be readily calculated, to SPIF constitutes a key element in the model. The value of SPIF at location $(x,y)$ depends not only on the value of aerial image intensity at $(x,y)$, but also on all the values of the aerial image intensity around $(x,y)$. Mathematically, the SPIF can be expressed as, $$\mathrm{SPIF}(x,y) = \mathcal{G}\{I(x,y)\} \tag{2}$$

Due to the complicated nature of the photolithography process, it is unlikely to derive an exact functional form of $\mathcal{G}$ based on first physical principles. As such, an approximate functional form of $\mathcal{G}$ is utilized. This is possible only if the aerial image $I(x,y)$ has finite effective degrees of freedom, which is true according to Shanon's sampling theorem, since the aerial image $I(x,y)$ is a bandlimited function, as discussed in C. E. Shannon, Proc. IRE, 37, (1946), 429, herein incorporated by reference.

Figure 1:
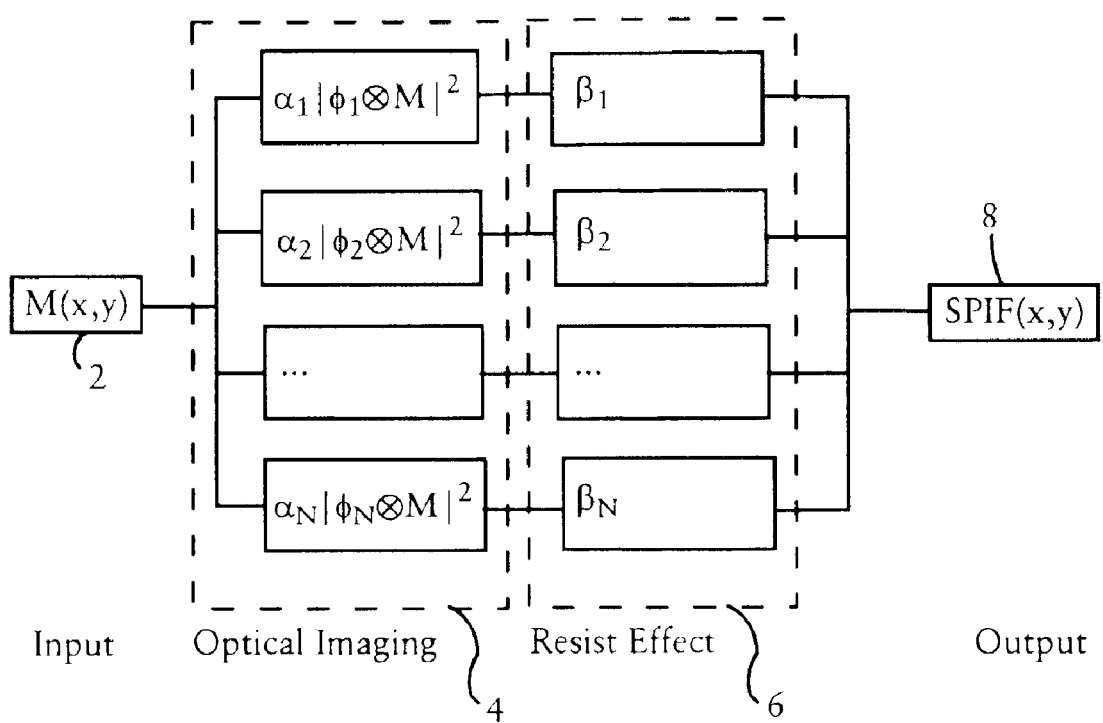
FIG. 1 illustrates an exemplary scalar eigen decomposition model according to the present invention.

An overview of a first exemplary embodiment of the invention in which a scalar EDM approach is used is illustrated in FIGS. 1 and 2. Referring to FIGS. 1 and 2, an input 2 containing characteristics of the mask pattern is provided to an optical imaging model 4, step S100. Eigen functions and eigen values representing the imaging process are determined from characteristics of the illumination source and imaging process to be utilized including, for example, the numerical aperture NA and the wavelength λ, step S102. The characteristics of the mask (i.e., the target pattern) are used to determine a mask function $M(x,y)$, step S104, which is provided as input 2. The aerial image is determined by convoluting the eigen functions with the mask function $M(x,y)$, step S106. A scalar indicative of the resist effect 6 may be utilized in determining the aerial image to account for the effect a particular resist has on the actual aerial image. A predetermined constant threshold is applied to the aerial image to generate an initial SPIF with predicted contours, step S108. The predicted contours are compared to known contours of the mask image, which are determined by actually printing the mask image using the same illumination condition, step S110. If the predicted contours are within a predetermined error tolerance of the measured contours, step S112 YES, then the predictive model is certified as being an accurate model and the model calibration is complete, step S114. If the predicted contours are not within a predetermined error tolerance, step S112 NO, then the weight of each term associated with each eigen function, which define the imaging process, is adjusted, step S116 and a new SPIF is produced. Then, a the constant threshold is applied to the new SPIF, step S108, and the process in steps S108-116 continues until a model is produced which provides contours within the predetermined error tolerance. However, since it may not be possible to accurately model some mask layouts utilizing the selected eigen function, the modeling process preferably stops after failing to provide contours within the predetermined error tolerance after a predetermined number of attempts.

Once the model is calibrated, it can be used to simulate the aerial image for any mask simply by providing the parameters of the mask as illustrated in FIG. 1. It is noted that the model is valid for the given process illumination conditions. If the illumination conditions were modified, a new model would have to be generated. This is advantageous because the designer can now easily modify the target mask to model OPC features and then input the target mask into a simulator utilizing the model. The output of the model provides the aerial image produced by the modified mask. It the aerial image is in within acceptable design limits, the process is complete. However, if the aerial image is not acceptable, the designer can again modify the input mask pattern to another simulator process. This process may be continued until an acceptable image is obtained.

In determining the eigen functions and eigen values, as illustrated in step S102 of FIG. 2, a set of parameters indicative of the characteristics of the optical imaging system are provided as one or more basis functions of generally the same bandwidth. An optimal basis function among all the possible sets of basis functions with bandwidth $\Omega$ may be determined using a decomposition technique. By the optimal set of basis functions, it is meant that the number of the basis functions that are needed from the set is minimum to approximate any real valued function of bandwidth $\Omega$ for any specified error requirement. Preferably, such an optimal set of basis functions must represent the optical imaging system (illumination, pupil, etc.) most effectively, and be independent of the object to be imaged. Starting from the imaging formula of Hopkin's in the scalar regime:

$$I(x, y) = \int_{-\infty}^{\infty}\int_{-\infty}^{\infty}\int_{-\infty}^{\infty}\int_{-\infty}^{\infty} \gamma(x_1 - x_2, y_1 - y_2) \quad (3)$$
$$K(x - x_1, y - y_1)K^*(x - x_2, y - y_2)$$
$$M(x_1, y_1)M^*(x_2, y_2)dx_1 dy_1 dx_2 dy_2$$

where $\gamma(x_2-x_1, y_2-y_1)$ is the mutual coherence between $(x_1, y_1)$ and $(x_2, y_2)$ at the object plane, which is determined by illumination, and $K(x-x_1, y-y_1)$ is the impulse response function of the optical imaging system, which is determined by the pupil function of the optical system. More explicitly, $K(x-x_1, y-y_1)$ is the complex amplitude at the point $(x, y)$ in the image plane, due to a disturbance of unit amplitude and zero phase at $(x_1, y_1)$ in the object plane. $M(x_1, y_1)$ is the complex transmission of the object at point $(x_1, y_1,)$. A variable with asterisk refers to the conjugate of the variable, for example, $K^*$ is the conjugate of $K$ and $M^*$ is the conjugate of $M$.

Equation (3) can be written in another form by changing the integration variables, $$I(x, y) = \int_{-\infty}^{\infty}\int_{-\infty}^{\infty}\int_{-\infty}^{\infty}\int_{-\infty}^{\infty} \gamma(x_2' - x_1', y_2' - y_1') \quad (4)$$
$$K(x_1', y_1')K^*(x_2', y_2')M(x - x_1', y - y_1')$$
$$M^*(x - x_2', y - y_2')dx_1' dy_1' dx_2' dy_2'$$

Let $$W(x_1', y_1'; x_2', y_2') = \gamma(x_2' - x_1', y_2' - y_1')K(x_1', y_1')K^*(x_2', y_2') \quad (5)$$

Since $$\gamma(x_2' - x_1', y_2' - y_1') = \gamma^*(x_1' - x_2', y_1' - y_2') \quad (6)$$

One has $$W(x_1', y_1'; x_2', y_2') = W^*(x_2', y_2'; x_1', y_1') \quad (7)$$

The integral operator W that satisfies the relation of equation (7) is called a hermitian operator. According to the Mercer's theorem (described in A. V. Balakrishnan, Applied Functional Analysis, (1976), herein incorporated by reference), for a hermitian operator, there exists a complete set of orthonormal functions $\{\phi i\}$ such that W can be expanded onto $\{\phi i\}$ diagonally, $$W(x_1', y_1'; x_2', y_2') = \sum_{j=1}^{\infty} \alpha_j \phi_j(x_1', y_1') \phi_j^*(x_2', y_2') \quad (8)$$

An integral equation can be easily obtained from equation (8) by first multiplying $\phi_i(x_2'y_2')$ on both sides, and then integrating over variables $x_2$ and $y_2$ on both sides. Since $\{\phi_j\}$ is orthonormal, the only term that survives on the right side after integration is the term with j=i.

$$\iint W(x_1', y_1'; x_2', y_2')\phi_i(x_2', y_2')dx_2' dy_2' = \alpha_i \phi_i(x_1', y_1') \quad (9)$$

As illustrated by step S102 of FIG. 2, the eigen functions may be generated according to equation 9. Particularly, the orthonormal functions $\{\phi_i\}$ are the eigenfunctions of the integral operator W, which can be readily obtained through solving the integral equation (9), and $\{\alpha_i\}$ are the corresponding eigenvalues. As provided in equations (4) and (5), the integral operator W is also positive and semidefinite, because the aerial image intensity $I(x,y)$ at any location $(x,y)$ is non-negative for any given input mask pattern $M(x,y)$. This condition imposes further restrictions on the values of $\{\alpha_i\}$ that they must be non-negative and bounded. It is always possible to order the eigen functions $\{\phi_i\}$ according to their eigenvalues $\{\alpha_i\}$ such that $\alpha_1 \geq \alpha_2 \geq \alpha_3 \geq \ldots > 0$. Degenerate functions can arise if the illumination and the pupil function possess certain symmetries. Degenerate functions refer to functions that possess the same eigenvalue.

As illustrated by step S105 of FIG. 2, the aerial image is calculated by the convolution of the mask function $M(x,y)$ with the eigen functions. More particularly, with an orthonormal set of functions $\{\phi_i\}$, the aerial image can be calculated using the following equation by inserting equation (8) into equation (4).

$$I(x, y) = \sum_{i=1}^{\infty} \alpha_i |\phi_i \otimes M|^2 \quad (10)$$

where $\otimes$ represents the convolution operation between the eigen function $\phi_i$ and the mask transmission function M. In the language of imaging theory, equation (10) shows that a partially coherent imaging system can be decomposed into a series of coherent imaging systems. Although there are other methods to decompose a partially coherent imaging system into a series of coherent imaging systems, the method described above has been proven to be an optimal one, often called optimal coherent decomposition. See, for example, Y. C. Pati and T. Kailath, J. Opt. Soc. Am. A 11, (1994), 2438, herein incorporated by reference. Accordingly, the optimal coherent decomposition technique described by equation 10 is preferably used in the optical imaging model 4.

Any number of orders (transmission channels) for the aerial image of $\phi_{1-N}$ may be used as illustrated in FIG. 1. However, for most currently employed illuminations in semiconductor manufacturing, only the first few transmission channels are significant. It is noted that the recorded signal from the ith channel is not the complex amplitude $\phi_i \otimes M$, but the intensity $|\phi_i \otimes M|^2$. There exist no cross terms $(\phi_i \otimes M)(\phi_j \otimes M)^*(i \neq j)$, because the complex amplitudes from different channels bear no correlation at all in phase, and their averaged values over time are zero. In other words, in the model of the present invention and utilized herein, the basic signals are intensity-like $\{|\phi_i \otimes M|^2\}$, not electric field-like $\{\phi_i \otimes M\}$.

After the significant signals are determined, the SPIF is determined as illustrated in step S106. Particularly, with the eigen decomposition method of the present invention, it is possible to achieve an effective and accurate way to describe the aerial image intensity distribution around a point of interest (x, y). Denoting the signal from ith channel as $S_i$, $$S_i = \alpha_i |\phi_i \otimes M|^2 \tag{11}$$

then the functional form $\mathcal{G}$ in equation (2), which represents the transformation from the aerial image I(x,y) into the SPIF (x,y), can be expressed as $$\text{SPIF}(x,y) = G(S_1(x,y), S_2(x,y), \ldots S_N(x,y)) \tag{12}$$

As illustrated in FIG. 1, the SPIF 8 is preferably determined using equation 12 above. In the foregoing equation, an assumption has been made that only the signals from the first N channels are significant. Since the exact functional form that describes the dependence of SPIF on $\{S_i\}$ is unknown, a successive correction approach is taken. This approach is based on the fact that the contours predicted from thresholding the aerial image using a constant threshold are in fair agreement with those from experiments, even though the agreements are not quantitatively satisfactory.

Contours of the predicted SPIF are compared to experimentally determined contours produced by a test pattern, step S112. If the predicted contours are within a predetermined tolerance of the experimentally determined contours, then the model calibration is complete, step S114. However, if the predicted contours are not within the predetermined tolerance, then the weight of each term associated with each eigen vector is adjusted, step S116, and a new SPIF is produced according to the principles discussed above. The constant threshold is applied to the new SPIF, step S108, and the process in steps S108-116 repeats until the model calibration is complete or a predetermined number of attempts have been tried.

In the implementation, 2D CD SEM images are preferably used instead of the critical dimension (CD) measurements for model calibration. Theoretically, only N independent measurements are needed to determine the N independent coefficients $\{\beta_i, I=1, 2 \ldots N\}$ for a first order eigen decomposition model. However, there always exist noise in real measurements that can cause uncertainties in determining the coefficients $\{\beta_i, I=1, 2 \ldots N\}$. To reduce the uncertainties of $\{\beta_i, I=1, 2 \ldots N\}$ from calibration, more CD measurements are demanded. This requires more engineering time and more expensive equipment time, it also slows down the model calibration process. A way to achieve accurate determination of $\{\beta_i, I=1, 2 \ldots N\}$ while minimizing the necessary amount of engineering work is to use CD SEM images, instead of CD measurements. The SEM images cover a wider range of structural variations and contain enormous data points for model calibration; therefore, the calibration from CD SEM images are more stable statistically. The advantage of using CD SEM images over CD measurements for model OPC calibration becomes even more pronounced for 193 nm photolithography process, due to instability of 193 nm resists under electron beam exposure.

For a second order eigen decomposition model, there is another compelling reason to use CD SEM images for model calibration. CD measurements are usually taken at locations where the structures possess certainty symmetries. Since the eigenfunctions also possess certain symmetries inherited from the symmetry of the illuminator, there will be no signals from channels that change polarity under the symmetry operation of the structure being evaluated. For example, if a CD value is taken at the middle of a very long vertical line, the structure is symmetrical to the mirror operation $(x,y) \Leftrightarrow (x,-y)$, i.e., $M(x,y)=M(x,-y)$ if the origin is set at the CD measurement point. For a Quasar illumination, although the polarities remain the same for the first two eigenfunctions under the mirror operation $(x,y) \Leftrightarrow (x,-y)$, the polarities of the 3rd and 4th eigenfunctions are changed. Therefore, there are essentially no signals from 3rd and 4th channels at the CD measurement point. The interactions between signals of ($S_1$, $S_2$) and signals of ($S_3$, $S_4$) cannot be determined. The second order interaction coefficients obtained from calibrating the model to CD measurements are likely determined by the noise to a large extent, which leads to unacceptable errors during model OPC for a pattern at locations where all signals are present.

In the low k1 era, the CD SEM images are most likely of low contrast, with some noise. To reduce the high frequency noise, a Gaussian filter can be applied on the original CD SEM image. The intensity value at a given pixel in the outcome image is a Gaussian weighted average intensity of the pixels with the Gaussian centered at that pixel. The image contrast after Gaussian filtering is always reduced. To recover the image contrast, the image contrast enhancement operation can be applied subsequently. After high frequency noise is removed, and contrast of the image has been enhanced to a reasonable level, a contour extraction operation is applied. Although there are several contour extraction methods, they are all based on the derivatives of the image. Because of the nature of the CD SEM images from low k1 technologies, a completely connected contour that defines a feature in the image is not always guaranteed, no matter how many image enhancement operations are applied before contour extraction. To complete the contour definition, some human intervention may be necessary. The method of the present invention operates to minimize human intervention while the task of completing the contour definition is guaranteed.

For each feature of the current image that will be included in the calibration, we first check whether the contour enclosing the feature is complete, i.e., there are no broken segments. If the contour is not complete, then there are several approaches to accomplish this task, which have been implemented in software, as shown in FIGS. 11-17.

Figure 11:
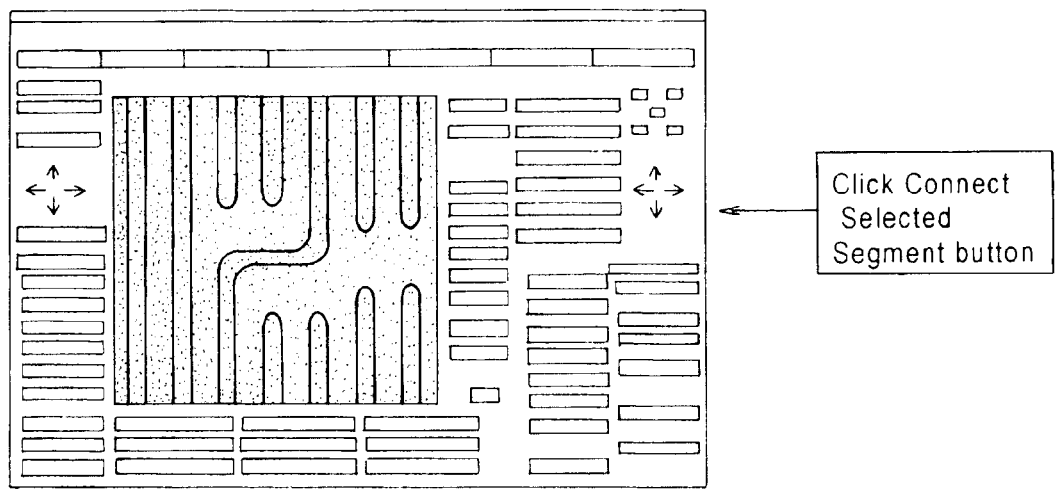
FIGS. 11-15 illustrate a process for connecting segments of an exemplary contours from an exemplary mask patterns determined according to the principles of the invention.

FIGS. 11-17 illustrate a process for connecting segments of an exemplary contours from an exemplary mask patterns determined according to the principles of the invention. As illustrated in FIG. 11, the model of the present invention may result in broken contour segments around a feature which must be connected. A simulator program operating in accordance with the principles of the present invention may allow a correction to be made by using a mouse to point at the segments along the boundary. The outer edges of the contour segments may be selected for line features, and all segments for a given feature may also be selected. If there are broken contour segments around the feature, specific functions may be selected to be performed, such as by clicking on an instruction to connect selected segments then click, causing the broken contour segments will preferably be connected automatically.

Figures 12A, 12B:
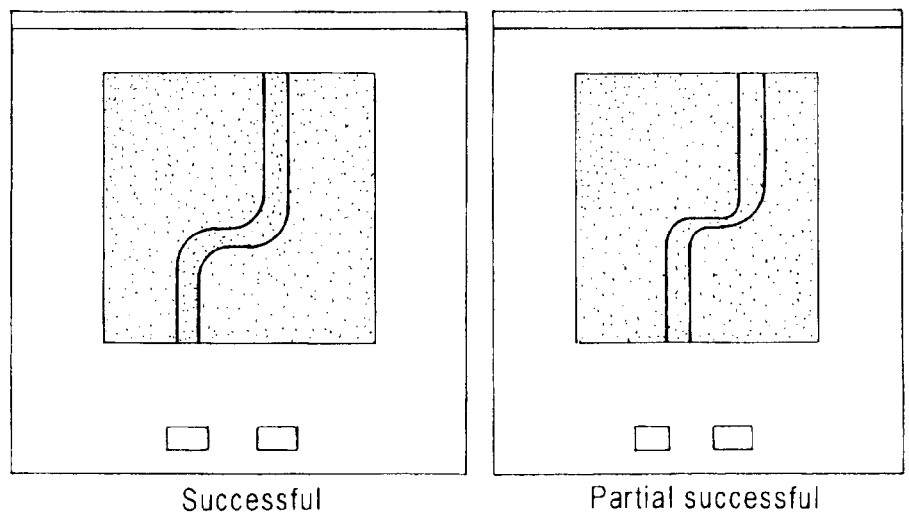
Figure 13:
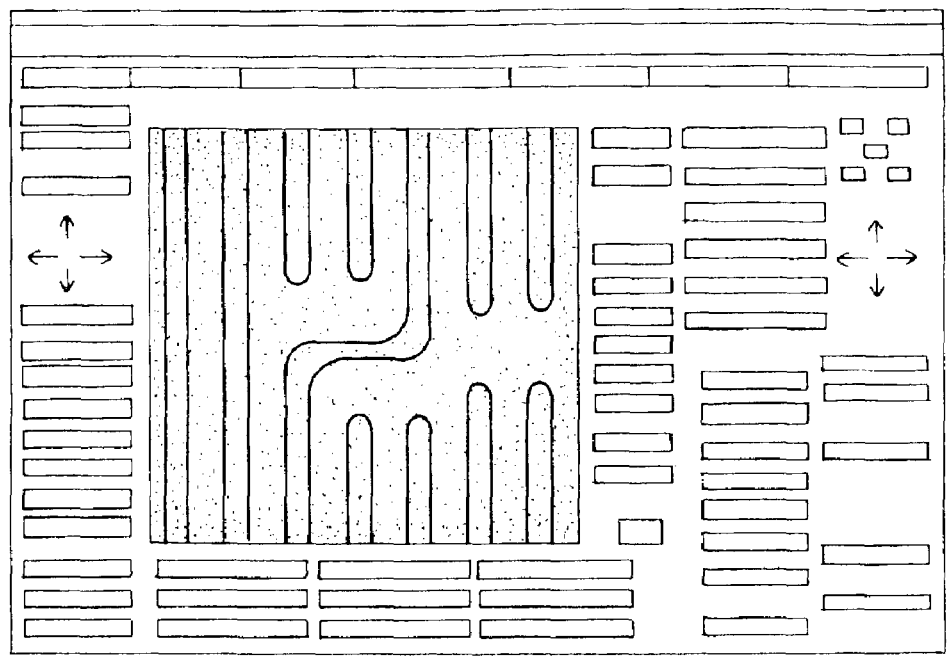
Figure 14:
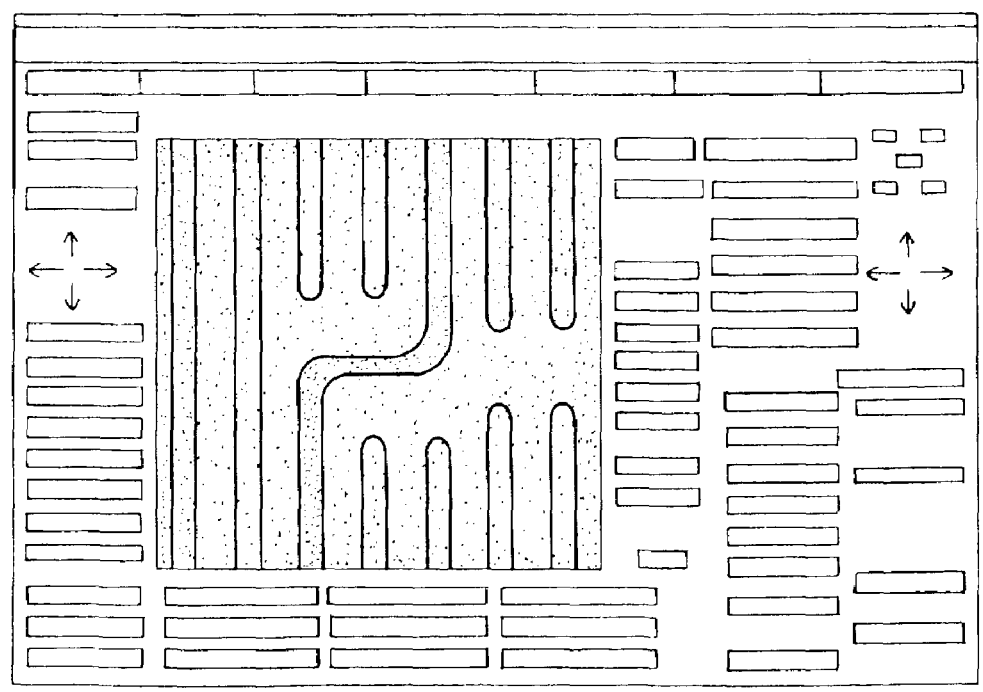
Figure 15:
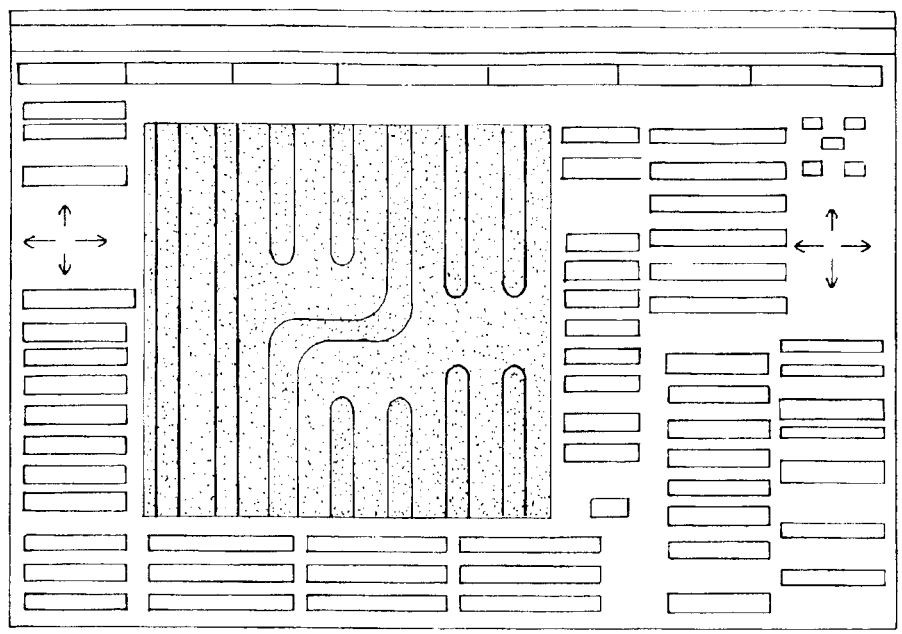

Like any other image processing routines, there is no guarantee that the instruction to connect selected segments will be successful, due to complex nature of the operation. FIG. 12A illustrates a successful connection of the contours and FIG. 12B illustrates a partially successful connection of the contours. The operator can select another function to repair a broken segment, then use mouse to define the broken region. Preferably, the software connects the segments automatically. Caution should be taken in this approach to avoid unwanted segments in the mouse defined region. If it is not possible to avoid the unwanted segments, the unwanted segments in the region of interest must be cleaned up. In the event that the attempt to connect the segments fails, the operator can perform a function of adding contour points, then zoom in the image and navigator the image so that the missing pixel(s) to connect broken segments can be located clearly in the view. Then the mouse can be used to point at that pixel location. The missing pixel will preferably be added, thus the previously broken segments are connected.

As illustrated in FIGS. 13-16, once the contour segment around a given feature is complete, the user can define the boundary for filling by first performing the function of defining the fill boundary button and then use the mouse to point at the boundary segment and click the left mouse button.

Figure 16:
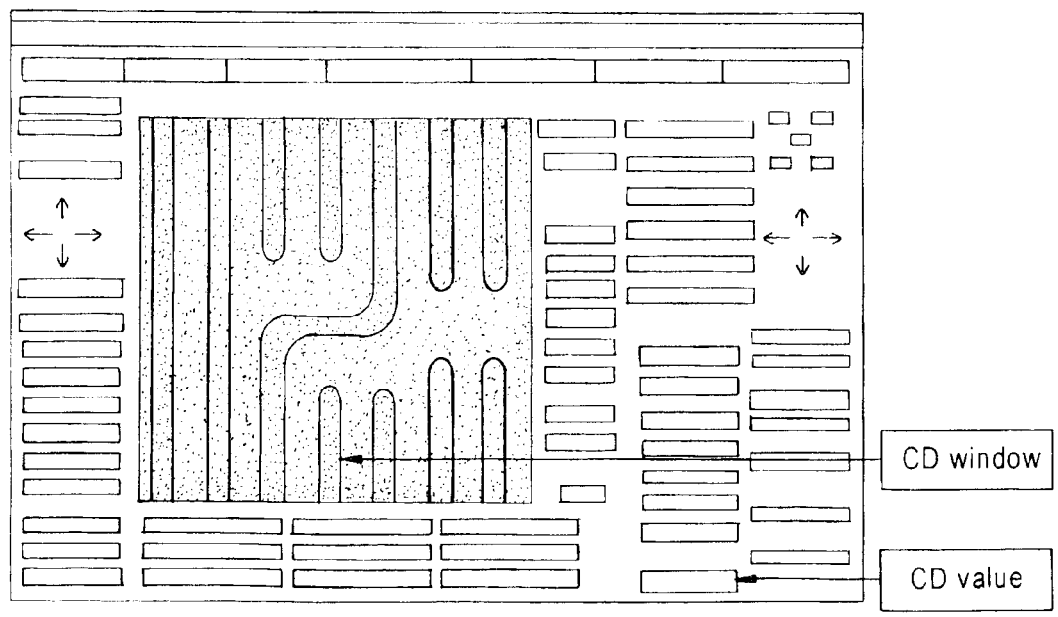
FIG. 16 illustrates obtaining the CD values from an extracted contour.

FIG. 16 illustrates obtaining the CD values from an extracted contour. Since the algorithm used for contour extraction from the SPIF may differ from the algorithm used for obtaining CD values from CD SEM machines, it is necessary to perform a "calibration" between these two algorithms. To achieve this calibration, the CD measurement window may be defined and the corresponding CD value may be input. It only requires one CD measurement for each image.

Figure 17:
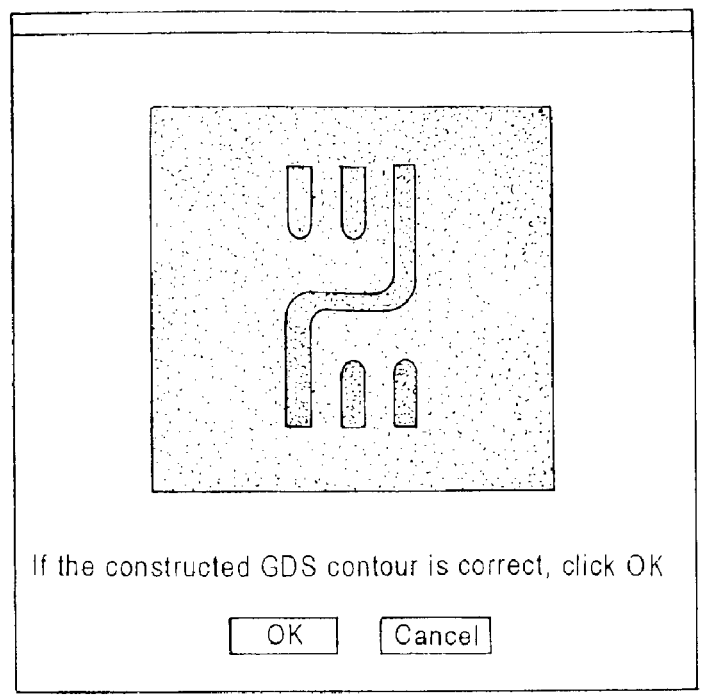
FIG. 17 illustrates presenting contours of an exemplary mask pattern in a GDSII format.
Figure 18:
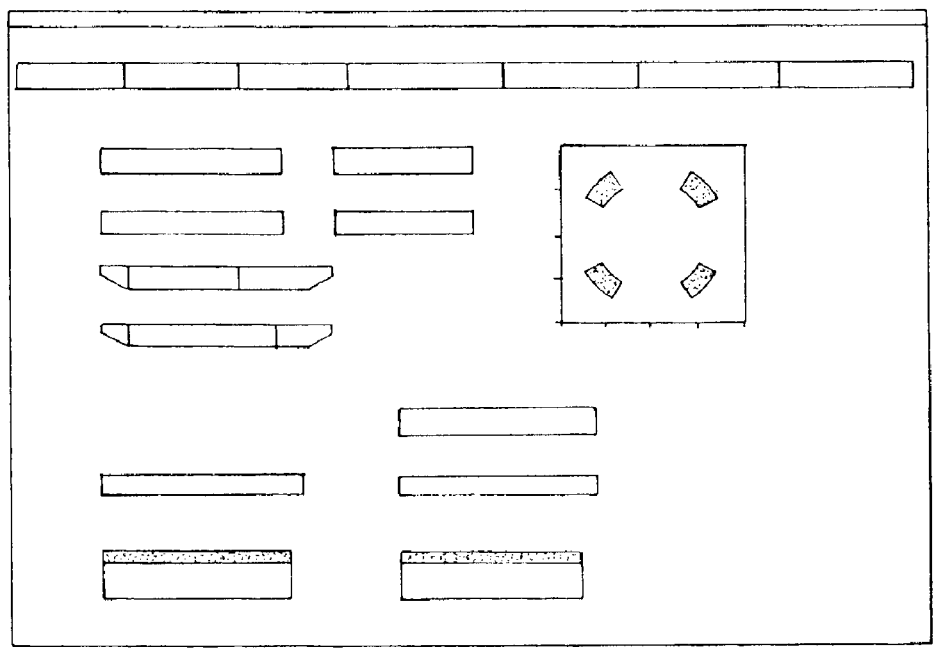
FIGS. 18-20B illustrate an implementation of the model of the present invention with an exemplary mask pattern with Quasar illumination and 248 nm exposure light.

Once the steps of extracting the contours is achieved, the features can be converted into contour data format, for example, the GDSII format, commonly in use, as illustrated by FIG. 17. Once all the images of interest have been successfully converted into contours, such as GDS II data format, calibration can be done by an optimization algorithm that automatically adjusts the parameters to achieve minimal error between experimental contours and model contours. There are two groups of parameters that get adjusted during calibration. One group of parameters is the model parameters that are common to all image sets, and the other group of parameters is the geometrical parameters that can be further broken down into two subgroups, namely, {X-scaling, Y-scaling, rotation} and {X-shift, Y-shift}. While {X-shift, Y-shift} should always be adjusted independently for each image set, {X-scaling, Y-scaling, rotation} can be either locked for all image sets or unlocked to allow independent adjustment for each image set. Whether {X-scaling, Y-scaling, rotation} should be locked or unlocked depends on the causes of the deviation. If one believes the causes are common and the amount of adjustment are the same for all image sets, for example, the dominant causes are reticle scaling/rotation and scanner/step scaling/rotation, then {X-scaling, Y-scaling, rotation} should be locked. If one believes the causes are image set dependent, for example, the dominant cause is the CD SEM focus and astigmatism adjustments between each image taking, then {X-scaling, Y-scaling, rotation} should be unlocked. After the model calibration is done through the optimization routine, the calibration results can be viewed and analyzed for model goodness evaluation. If the calibration results are satisfactory, the calibration file that contains the model parameters can be saved for further verification and prediction, it can also be used for full chip model OPC treatment.

If the contours cannot be extracted or connected from the current calculations of the model, a series expansion may be used. Particularly, the series expansion may be used to reduce the deviation of SPIF determined in a prior calculation of the model from the measured aerial image I(x,y). Taking Taylor expansion for the right side of equation (12), one has:

$$SPIF(x, y) = G(0, 0, \ldots, 0) + \sum_{i=1}^{N} \beta_i S_i(x, y) + \sum_{i=1}^{N} \sum_{j=1}^{N} \eta_{ij} S_i(x, y) S_j(x, y) + \ldots \quad (13)$$

The coefficients $\{\beta_i\}$ and $\{\eta_{ij}\}$ account for the effect of resist process, they also include the effects of other "non ideal" factors such as topography on masks and aberrations in the imaging system.

If only the first order terms are preserved, then the model is first order, and the bandwidth of SPIF is the same as its original aerial image determined by the optical imaging system. When the first order model is not accurate enough, second order terms can be included in the model to generate a second order model. The second order model will have a bandwidth that is twice that of the original aerial image. The degrees of freedom in a first order eigen decomposition model is N, specified by $(\beta_1, \beta_2, \ldots \beta_N)$. The degrees of freedom in a second order eigen decomposition model is $N+N(N+1)/2$, due to the symmetry of the coefficients $\{\eta_{ij}\}$. The first order eigen decomposition model is depicted in FIG. 1.

An alternative way to introduce small components of larger bandwidth into SPIF is to add some additional kernels of large bandwidths, such as Gaussian functions or any other well behaved functions. The advantage of this approach, in comparison with the true second order eigen decomposition, is its simplicity and speed of implementation during model OPC operation. The coefficients $\{\beta_1\}$ and $\{\eta_{ij}\}$ can be determined from calibrating the model to experimental data, favorably CD SEM image data or AFM contour data or other two dimensional (2D) data from surface metrologies. The targeted data for calibration can also be dimension measurements such as CD measurements or any other data.

If an error in the contours is detected, the error is pixel size limited. The error is calculated along the feature edge, pixel by pixel. Since a CD measurement widow is always defined during a CD measurement, and there are preferably a considerable number of pixels in the measurement window, therefore, the CD error distribution will be significantly narrower.

B. Variable Threshold Eigen Decomposition Model

The model just described above is the constant threshold eigen decomposition model whose attraction lies in its simplicity in implementation. The basic ideas, however, can equally be applied and extended to develop similar models, most notably, the variable threshold eigen decomposition model. In the following, we describe one possible implementation. For any mask transmission function M(x,y), its aerial image can be easily calculated. Now, if one uses a predefined threshold, for example, 0.3, to cut the aerial image, its corresponding contours can be obtained. It should be understood that the contours thus obtained deviate from the experimental contours. It is the essence of the model to establish a relation that can transform the initially guessed contours to the correct contours. The process is illustrated in FIG. 3.

Figure 3:
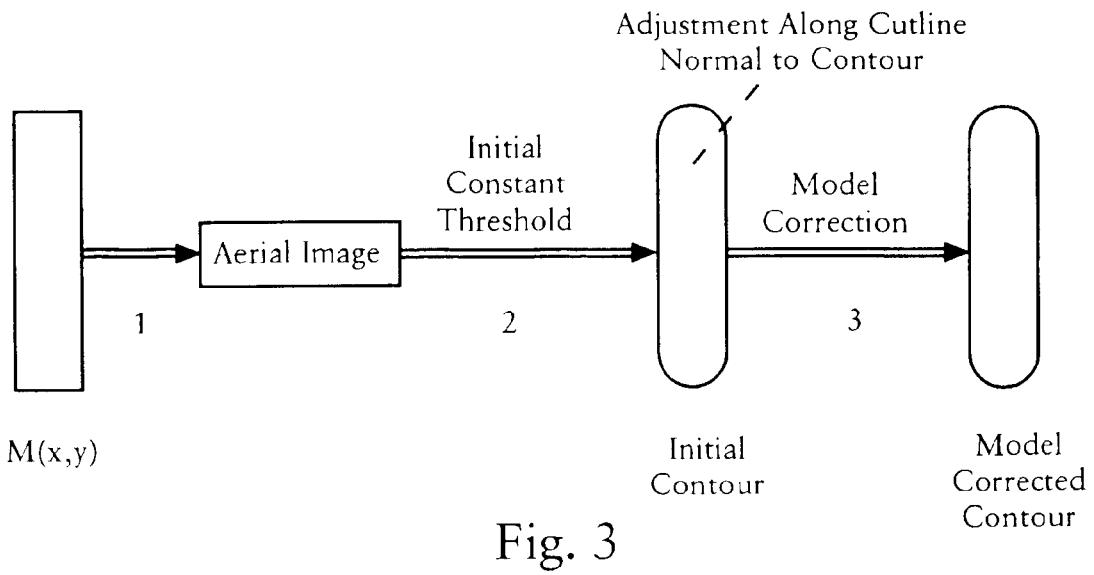
FIG. 3 illustrates an exemplary process for implementing the scalar eigen decomposition model with a variable threshold in accordance with the present invention.

As illustrated in FIG. 3, input parameters M(x,y) which are indicative of characteristics of a mask to be modeled are input in step S302. The aerial image of the mask is modeled using the input parameters and an EDM approach discussed above in step S304. The obtained aerial image is adjusted along a cutline in a direction normal to the contour of the image in step S306. Each point (x,y) on the initial contour will be adjusted along a cutline in the direction that is normal to the contour. The amount of adjustment depends on the supposedly correct threshold along the cutline normal to the contour. The model preferably provides a formula to calculate the correct threshold at the cutline normal to the contour. In the variable threshold eigen decomposition model, the correct threshold is assumed to depend on not only the aerial image intensity at location (x,y), but also on all of the values of aerial image around the point (x,y). In other words, a functional form similar to equation (2) may be utilized.

$$\text{Threshold}(x,y) = H(I(x,y)) \tag{14}$$

The functional form of H is not known, and it can only be approximated. Due to the finite degrees of freedom of the intensity I(x,y), it can be effectively expressed using a finite terms of the basic signals as defined in equation (11).

$$\text{Threshold}(x,y)|_{along\ cutline} = H(S_1(x,y), S_2(x,y), \ldots S_N(x,y)) \tag{15}$$

By successive approximation, equation (15) leads to $$\text{Threshold}(x, y)|_{along\ cutline} = const + \sum_{i=1}^{i=N} \chi_i S_i + \sum_{i=1}^{i=N}\sum_{j=1}^{j=N} \varepsilon_{ij} S_i S_j + \ldots \tag{16}$$

The basic signals utilized here possess decisive advantages over the other basic signals such as maximum intensity and log-slope since these basic signal constitute a complete set of signals, and are also orthogonal to each other. The completeness of the basic signals $\{S_1, S_2, \ldots\}$ improves accuracy, and the orthogonality eliminates complicated interference effects that exist if non-orthogonal signals are used. The coefficients $\{\chi_i\}$ and $\{\varepsilon_{ij}\}$ can be obtained from calibrating the model to experimental data.

The model corrected contour is generated in step S308 and preferably is used to implement OPC model. Although our eigen decomposition model OPC theory does not require the real illuminator profile from scanner/stepper, so long as the real illuminator profile does not deviate from the top hat illuminator profile significantly, the eigen functions calculated from a real illuminator, however, are expected to be more accurate than those from a corresponding top hat illuminator profile. In addition, there is a rapidly growing interest to employ more aggressive or advanced illumination designs in low k1 photolithography, such as customer designed illuminators. The development of a method that can calculate the eigenfunctions for a generalized illuminator has evidently become a pressing task.

Equation (9) is an equation in spatial domain, which can be solved in spatial domain. In turns out, however, that it is easier to solve it in frequency domain. In frequency domain, a similar equation can be derived.

$$\int\int \Gamma(f, g; f', g') \Phi_i(f', g') = \alpha_i \Phi_i(f, g) \tag{17}$$

where $$\Gamma(f, g; f', g') = \int_{-\infty}^{\infty}\int_{-\infty}^{\infty} \hat{I}_0(f'', g'') \hat{K}(f + f'', g + g'') \tag{18}$$

$$\hat{K}^*(f' + f'', g' + g'') df'' dg''$$

Both $I_0$ and $\Gamma$ are illuminator and impulse response functions in frequency domain. The model OPC eigen functions obtained by solving equation (17) are functions in frequency domain. The eigen functions may be obtained in spatial domain by an inverse Fourier transform on $\Phi_i$.

Vector Eigen Decomposition Model

Despite all the merits of the scalar EDM approach of the present invention, it shares a common trait with other commercial available models, that is, the model itself is a scalar model by nature, and the vector characteristic of light wave have been ignored. When the numerical aperture (NA) used in a photolithography process is low (e.g., below 0.7), the scalar EDM model OPC should be considered adequate and effective. When NA used in a photolithography process approaches 0.80 or even higher, there are some compelling reasons to extend the scalar EDM into a vector EDM that takes both vector characteristic of the light wave and the film stacks on the wafer into account.

The scalar EDM model assumes that the light wave can be treated as a scalar quantity, and the aerial image can be accurately calculated using the Hopkin's formula equation (3). However, when the NA used in a photolithography process gets higher, such an assumption may prove to be inadequate. There are several reasons that require the vector characteristic of light wave taken into account in high NA regime. First of all, there is noticeable light wave polarization conversion from the entrance pupil to the exit pupil. Secondly, the dependence of reflectivity on light wave polarization at the air/resist interface becomes more prominent. Although high NA imaging formulation that takes into account these corrections do exist, the optimal decomposition on the much more involved high NA imaging formulation is not available. Without such a decomposition scheme, OPC model cannot be extended into high NA regime.

Figure 4:
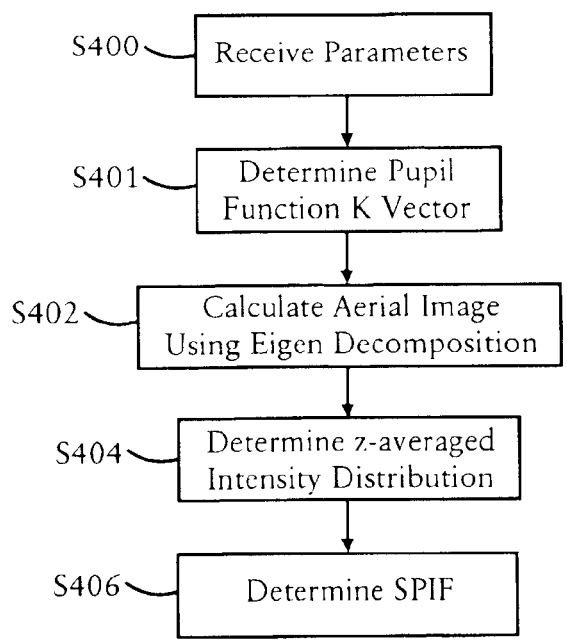
FIG. 4 illustrates an exemplary process for implementing a vector eigen decomposition model.

FIG. 4 illustrates an exemplary method for implementing a vector eigen decomposition model. As illustrated in FIG. 4, parameters of the imaging system are received, step S400. The parameters are used to determine the pupil function K, step S401. In the high NA imaging formulation, the pupil function K, which is a scalar function in the scalar model applicable to low NA cases, is preferably represented by matrix with nine elements.

$$K \Rightarrow \begin{bmatrix} K_{xx} & K_{xy} & K_{xz} \\ K_{yx} & K_{yy} & K_{yz} \\ K_{zx} & K_{zy} & K_{zz} \end{bmatrix} \tag{19}$$

Each $K_{ij}$ element depends on the optical imaging system and the film stacks over the wafer as well. Explicitly expressed in the frequency domain, $$K_{ij}(\alpha', \beta', z') = \sum_{k=x,y,z} \sqrt{\frac{\gamma}{\gamma'}} G_{ik}(\alpha', \beta', z') Q_{kj}(\alpha', \beta') e^{i\frac{2\pi}{\lambda}[W(\alpha',\beta')+\gamma'\Delta]} \quad (20)$$

where ($\alpha'$, $\beta'$) is the angular coordinates (frequency) in the exit pupil, $z'$ is the plane position in the resist relative to the air/resist interface. $W(\alpha', \beta')$ is the aberration function and $\Delta$ is the defocus.

$$\gamma' = \sqrt{1 - \alpha'^2 - \beta'^2}$$

$$\gamma = \sqrt{1 - (\alpha'^2 + \beta'^2)/N^2} \quad (21)$$

N is the reduction factor in the imaging system, its common values are 4 or 5 in most commercial photolithography exposure tools.

$Q_{kj}$ ($\alpha'$, $\beta'$) accounts for the light polarization conversion from j component in the object space into k component into the image space. $G_{ik}$ ($\alpha'$, $\beta'$; $z'$) accounts for the effect of light interference in the film stacks. The detailed expressions for $Q_{kj}$ ($\alpha'$, $\beta'$) and $G_{ik}$($\alpha'$, $\beta'$; $z'$) can be found in Donis G. Flagello, Tom Milster, Alan E. Rosenbluth, J. Opt. Soc. Am. A13 (1996), 53, and Michael S. Yeung, Derek Lee, Robert Lee and A. R. Neureuether, SPIE, Vol. 1927, (1993), 452, both of which are herein incorporated by reference. The light field within the resist is:

$$B_i(\alpha', \beta', z'; \alpha'_0, \beta'_0) = \quad (22)$$

$$\sum_{j=x,y,z} K_{ij}(\alpha', \beta', z') \mathcal{F}\{E_{o,j}(x_o, y_o); \alpha' - \alpha'_o, \beta' - \beta'_o\}$$

Where $B_i$ ($\alpha'$, $\beta'$; $z'$ $\alpha'_0$, $\beta'_0$) is the light field in the resist at a plane of depth $z'$ with polarization of i (i=x,y,z) from a plane wave of ($\alpha'$, $\beta'$) when the illumination is ($\alpha'_0$, $\beta_0$). $\mathcal{F}\{E_{Oj}(x0,y0); \alpha'-\alpha'_0, \beta'-\beta'_0\}$ is the Fourier transform of the mask with polarization j in the object space, evaluated at frequency $\{\alpha'-\alpha'_0, \beta'-\beta'_0\}$.

Assume the illumination is characterized by $\hat{O}(\alpha'_0, \beta'_0)$, then the aerial image in the resist at a plane of depth $z'$ is $$I(x, y; z') = \quad (23)$$

$$\sum_{j=x,y,z} \sum_{k=x,y,z} \int\int\int\int T_{j,k}(f, g; f', g'; z') F_j(f, g) F_k^*(f', g')$$

$$e^{2\pi i[(f-f')x+(g-g')y]} df\, dg\, df'\, dg'$$

where $$T_{j,k}(f, g; f', g'; z') = \int\int \sum_{i=x,y,z} \hat{O}(\alpha_o, \beta_o) \quad (24)$$

$$K_{ij}(f + \alpha_o, g + \beta_o, z') K_{ik}^*(f' + \alpha_o, g' + \beta_o, z') d\alpha_o d\beta_o$$

and (x,y) in equation (18) have been normalized to wavelength λ.

Note that $$T_{jk}(f,g;f',g';z') \neq T^*_{j,k}(f',g';f,g;z') \quad (24a)$$

This inequality invalidates the direct application of Mercea's theorem. Therefore, the optimal decomposition approach that has been used in scalar EDM can only be achieved by a proper re-grouping of different elements so that hermitian operators can be constructed.

Although $T_{jk}$ (f,g; f',g'; z') itself is not a hermitian operator, the following relation does hold, $$T_{j,k}(f,g;f',g';z') = T^*_{k,j}(f',g';f,g;z') \quad (25)$$

Equation (21) consists of nine integral terms in total. However, the z component light field in advanced photolithography exposure tools with a reduction factor of four or five is relatively small in comparison to x and y component light field in the object space. With this assumption, we have $$I(x, y; z') = \quad (26)$$

$$\sum_{j=x,y} \sum_{k=x,y} \int\int\int\int T_{j,k}(f, g; f', g'; z') \mathcal{F}_j(f, g) \mathcal{F}_k'(f', g')$$

$$e^{2\pi i[(f-f')x+(g-g')y]} df\, dg\, df'\, dg'$$

Furthermore, the illumination in exposure tool has no polarization preference in a statistical sense. The light intensity received by resist is a time-averaged quantity, therefore $F_j$ (f,g)$F^*_k$ (f,g) should be interpreted as a time-averaged quantities. With this understanding we have:

$$\overline{I(x, y; z')} = \quad (27)$$

$$\sum_{j=x,y} \sum_{k=x,y} \int\int\int\int T_{j,k}(f, g; f', g'; z') \overline{\mathcal{F}_j(f, g) \mathcal{F}_k'(f', g')}$$

$$e^{2\pi i[(f-f')x+(g-g')y]} df\, dg\, df'\, dg'$$

Equation (25) has expressed the time-averaged quantities explicitly. Here assumption has been made that the resist properties, such as refractive index and absorption coefficient, remain constant during exposure, so that $T_{jk}$ (f,g; f',g; z') is a time independent quantity that characterizes the imaging system, i.e., the optical imaging system and the film stacks. This assumption has been justified for all resists, particularly the chemical amplified resists employed in advanced photolithography.

Since only light fields emanating from the same illuminating source point can interfere with each other, and its polarization varies randomly, we can easily obtain the following equations, $$\overline{\mathcal{F}_x(f, g)\mathcal{F}_y'(f', g')} = \overline{\mathcal{F}_y(f, g)\mathcal{F}_x'(f', g')} = 0 \quad (28)$$

$$\overline{\mathcal{F}_x(f, g)\mathcal{F}_x'(f', g')} = \overline{\mathcal{F}_y(f, g)\mathcal{F}_y'(f', g')} = \frac{1}{2}\mathcal{F}(f, g)\mathcal{F}^*(f', g') \quad (29)$$

Here F is just the Fourier transform of the mask transmission function.

With equations (26) and (27), equation (25) can be further simplified, $$\overline{I(x, y; z')} = \qquad (30)$$

$$\frac{1}{2} \int \int \int \int [T_{x,x}(f, g; f', g'; z') + T_{y,y}(f, g; f', g'; z')] \mathcal{F}(f, g)$$

$$\mathcal{F}^*(f', g') e^{2\pi i [(f-f')x + (g-g')y]} df dg df' dg'$$

It is easy to verify that:

$$[T_{x,x}(f,g; f',g'; z') + T_{y,y}(f,g; f',g'; z')]^* = [T_{x,x}(f',g'; f,g; z') + T_{y,y}(f',g'; f,g; z')] \qquad (31)$$

In other words, the kernel:

$$[T_{x,x}(f,g; f',g'; z') + T_{y,y}(f,g; f',g'; z')]$$

is a hermitian operator, and it can be decomposed into, according to Mercea's theorem, $$[T_{x,x}(f, g; f', g'; z') + T_{y,y}(f, g; f', g'; z')] = \qquad (32)$$

$$\sum_{m=1} \alpha_m \phi_m(f, g; z') \phi_m^*(f', g'; z')$$

Inserting (30) into (28), we have:

$$\overline{I(x, y; z')} = \sum_{m=1} \alpha_m \left| \int \int \phi_m(f, g; z') \mathcal{F}(f, g) e^{2\pi i [fx + gy]} df dg \right|^2 \qquad (33)$$

Equation (31) gives the formula that calculates the light intensity distribution at a particular plane z=z' under the eigen decomposition scheme. Equation 28 is preferably used in step S402 of FIG. 4. However, in OPC modeling, the z-averaged light intensity distribution is an important factor, therefore a z-average procedure should be carried out. A straightforward way is to average $T_{i,i}$ (f,g; f',g'; z') (i=x,y) over resist thickness first.

$$< T_{i,i}(f, g; f', g') > = \frac{1}{d} \int_0^d T_{i,i}(f, g; f', g'; z') dz' = \qquad (34)$$

$$\frac{1}{d} \int \int \sum_{k=x,y,z} \hat{O}(\alpha_o, \beta_o) \left\{ \int_0^d K_{k,i}(f + \alpha_o, g + \beta_o, z') \right.$$

$$\left. K_{k,i}^*(f' + \alpha_o, g' + \beta_o, z') dz' \right\} d\alpha_o d\beta_o$$

There exists other approximate way to calculate the z-averaged quantity, notably, $$< T_{i,i}(f, g; f', g') > \approx \{ 2 * T_{i,i}(f, g; f', g'; z_0) + \qquad (35)$$

$$T_{i,i}\left(f, g; f', g'; z_0 + \frac{\lambda_0}{4n}\right) +$$

$$T_{i,i}\left(f, g; f', g'; z_0 - \frac{\lambda_0}{4n}\right) \} / 4$$

where n is the refractive index of the resist, $\lambda_0$ is the wavelength in vacuum, and $z_0$ is any position plane in the resist, preferably the middle plane of the resist film.

Accordingly, for implementation, one only needs to solve the following integral equation, $$\int \int [<T_{x,x}(f,g; f',g')> + <T_{y,y}(f,g; f',g')>] \Phi_n(f',g') df' dg' = \chi_n \Phi_n(f,g) \qquad (36)$$

With a complete set of functions $\{\Phi n\}$, which is not z' dependent, the z-averaged light intensity distribution in the resist film may be calculated.

$$< \overline{I(x, y)} > = \sum_{n=1} \chi_n \left| \int \int \Phi_n(f, g) \mathcal{F}(f, g) e^{2\pi i [fx + gy]} df dg \right|^2 \qquad (37)$$

Equation (35) is the final result the extended vector EDM of the present invention, and is preferably used in step S406 of FIG. 4.

Although the eigen decomposition model theory does not require the real illuminator profile from scanner/stepper, so long as the real illuminator profile does not deviate from the top hat illuminator profile significantly. The eigen functions calculated from a real illuminator, however, are generally more effective than those corresponding to a top hat illuminator profile. In addition, there is a rapidly growing interest to employ more aggressive or advanced illumination designs in low k1 photolithography, such as customer designed illuminators.

Figure 5:
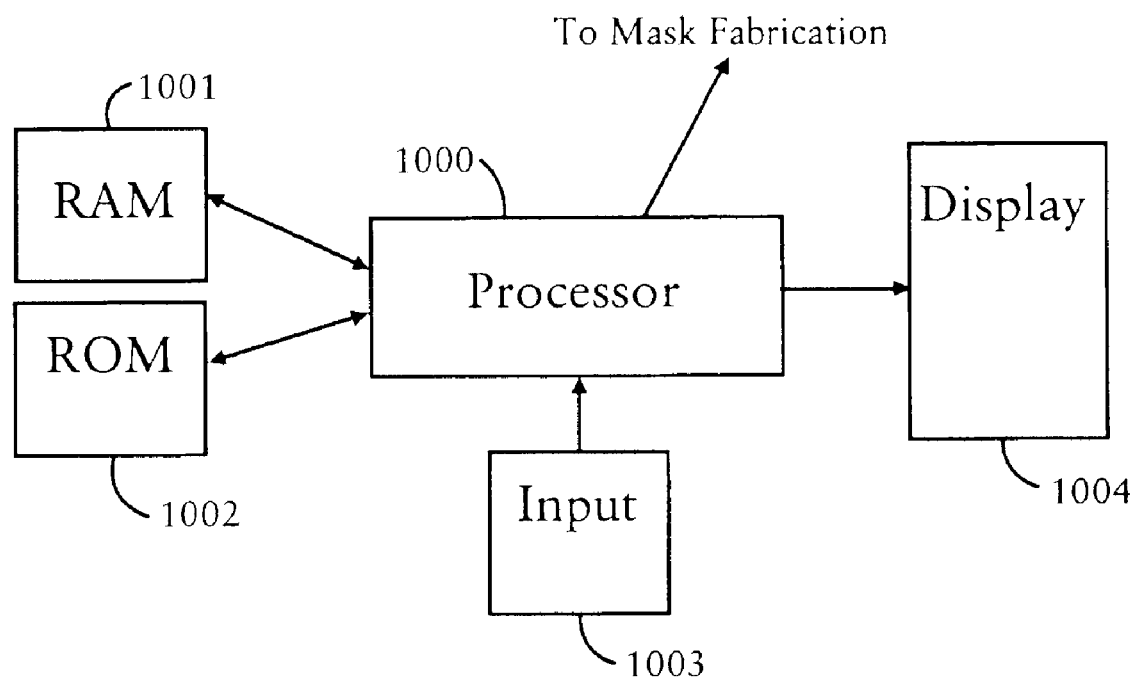
FIG. 5 illustrates an exemplary processing system for implementing the eigen decomposition models illustrated in FIGS. 1-3.

FIG. 5 illustrates an exemplary processing system for implementing the eigen decomposition models illustrated in FIGS. 1-4. As illustrated in FIG. 4, an exemplary mask optimization unit may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the processing illustrated in FIGS. 1-4, and stores information on RAM 1001. The calculated results of processor 1000 may be displayed on display 1004 and may be provided to a mask fabrication unit.

Figure 6:
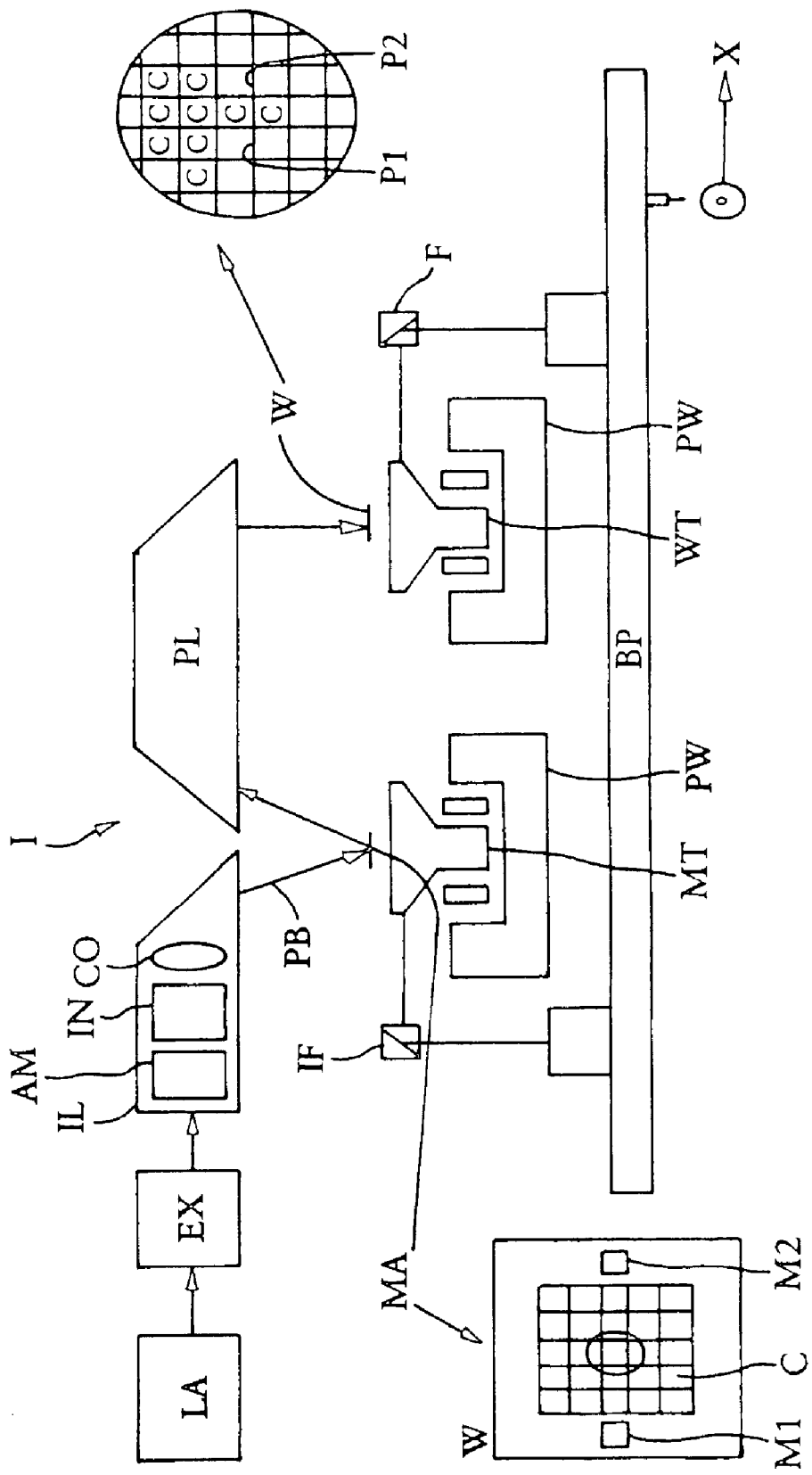
FIG. 6 schematically depicts a lithographic projection apparatus suitable for use with a mask designed with the aid of the current invention.

FIG. 6 schematically depicts a lithographic projection apparatus suitable for use with a mask designed with the aid of the current invention. The apparatus comprises:

B. a radiation system Ex, IL, for supplying a projection beam PB of radiation. In this particular case, the radiation system also comprises a radiation source LA;

C. a first object table (mask table) MT provided with a mask holder for holding a mask MA (e.g. a reticle), and connected to first positioning means for accurately positioning the mask with respect to item PL;

D. a second object table (substrate table) WT provided with a substrate holder for holding a substrate W (e.g. a resist-coated silicon wafer), and connected to second positioning means for accurately positioning the substrate with respect to item PL;

E. a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 6 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The illumination source intensity may also be made with a mirror array or an LCD. The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 6. However, in the case of a wafer stepper (as opposed to a step-and-scan tool) the mask table MT may just be connected to a short stroke actuator, or may be fixed.

The depicted tool can be used in two different modes:
B. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
C. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of processor 1000 preferably involve programming, including executable code, may be used to implement the above described processes in FIGS. 1-4. The software code is executable by the general-purpose computer. In operation, the code and possibly the associated data records are stored within a general-purpose computer platform. At other times, however, the software may be stored at other locations and/or transported for loading into an appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 7:
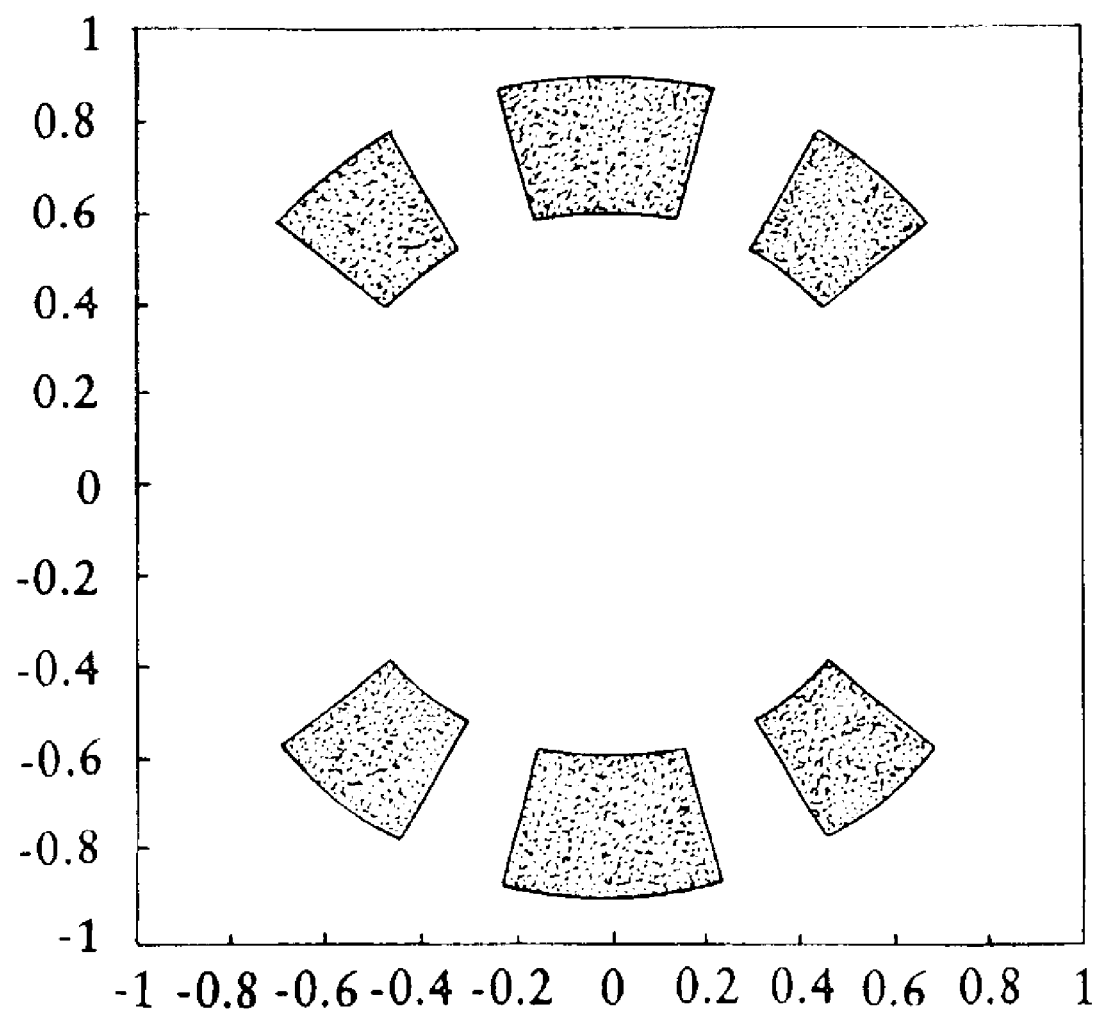
FIGS. 7 and 8 illustrate exemplary images derived using four eigen functions using a constant threshold eigen decomposition model with a top hat illumination.
Figure 8A:
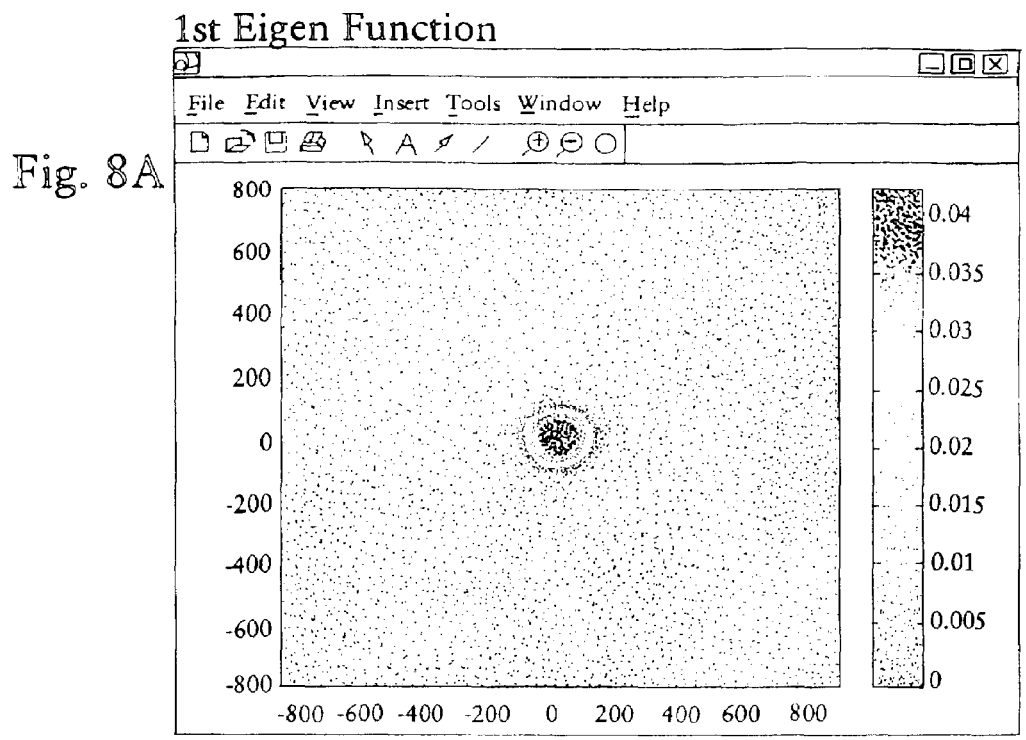
Figure 8B:
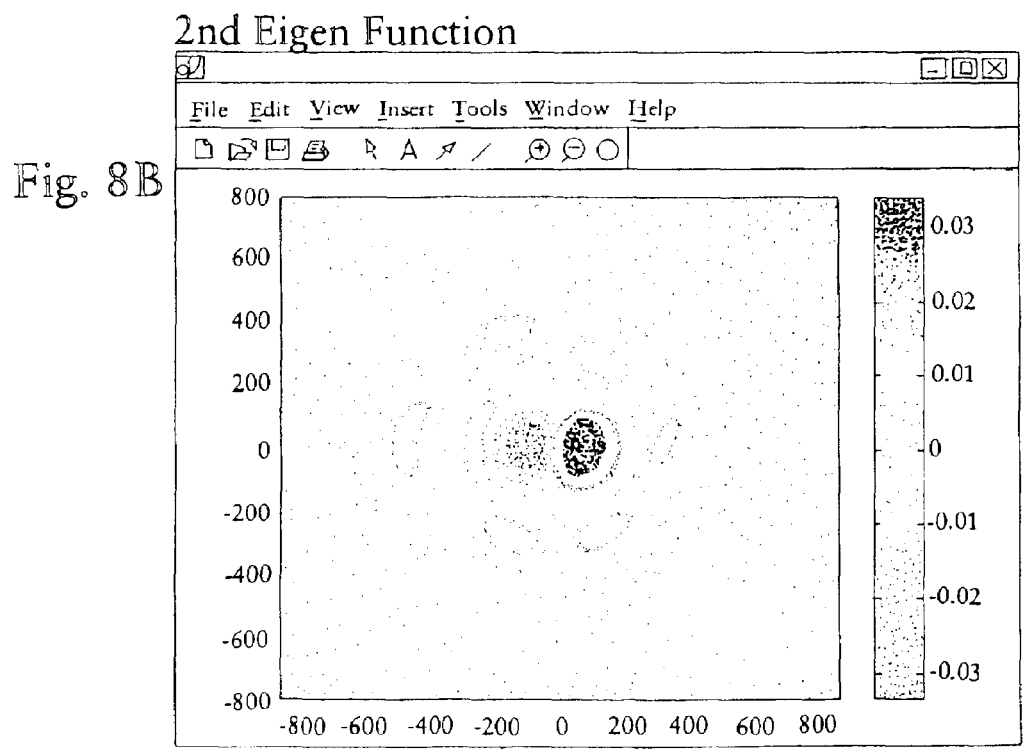
Figure 8C:
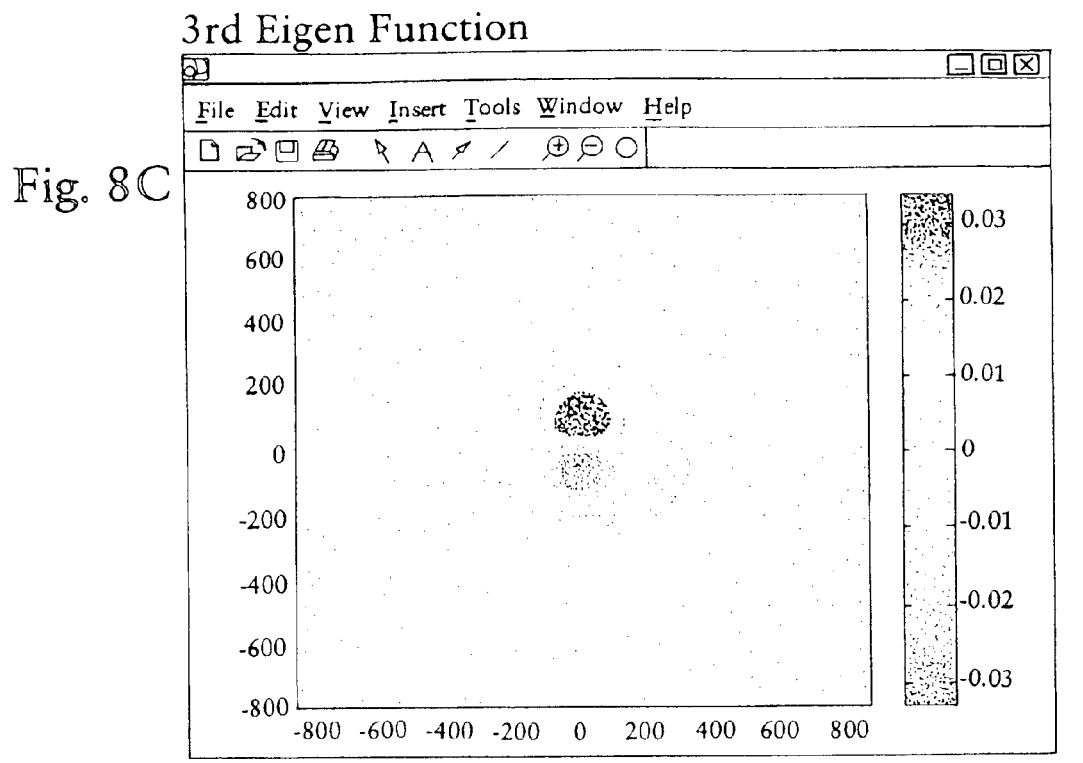
Figure 8D:
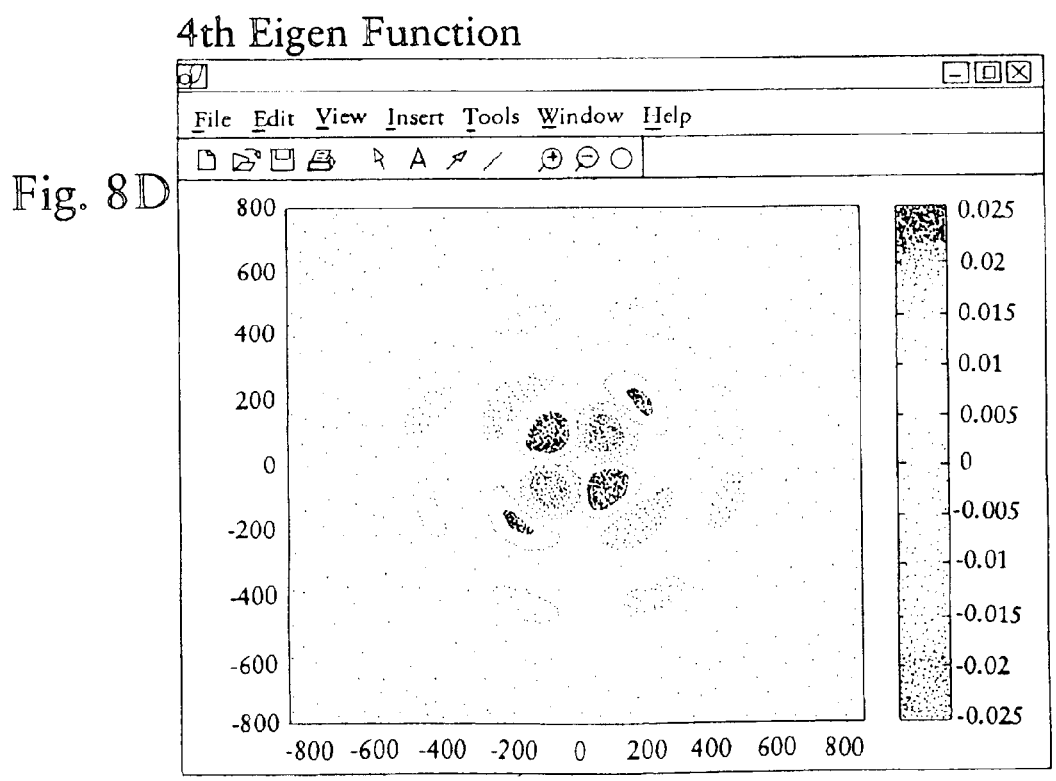

FIGS. 7 and 8 illustrates an exemplary images derived using four eigen functions using constant threshold eigen decomposition model of the present invention. FIG. 7 illustrates a hex-pole illuminator as an example of "top-hat" customized illumination. FIG. 8 illustrates the first, second, third and fourth corresponding eigen functions which are estimated. Higher order eigen functions can be derived using the method of the present invention.

Figure 9:
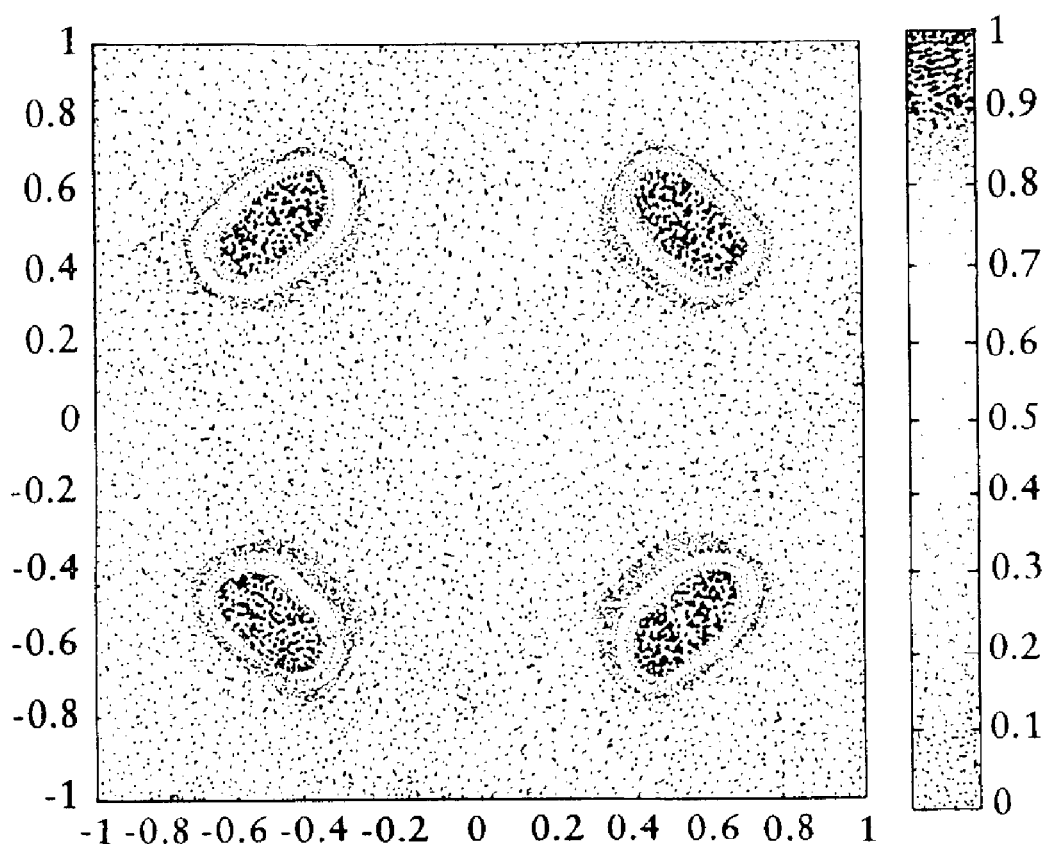
FIGS. 9 and 10 illustrate exemplary derived images using four eigen functions using a constant threshold eigen decomposition model with a quasar illumination.
Figure 10A:
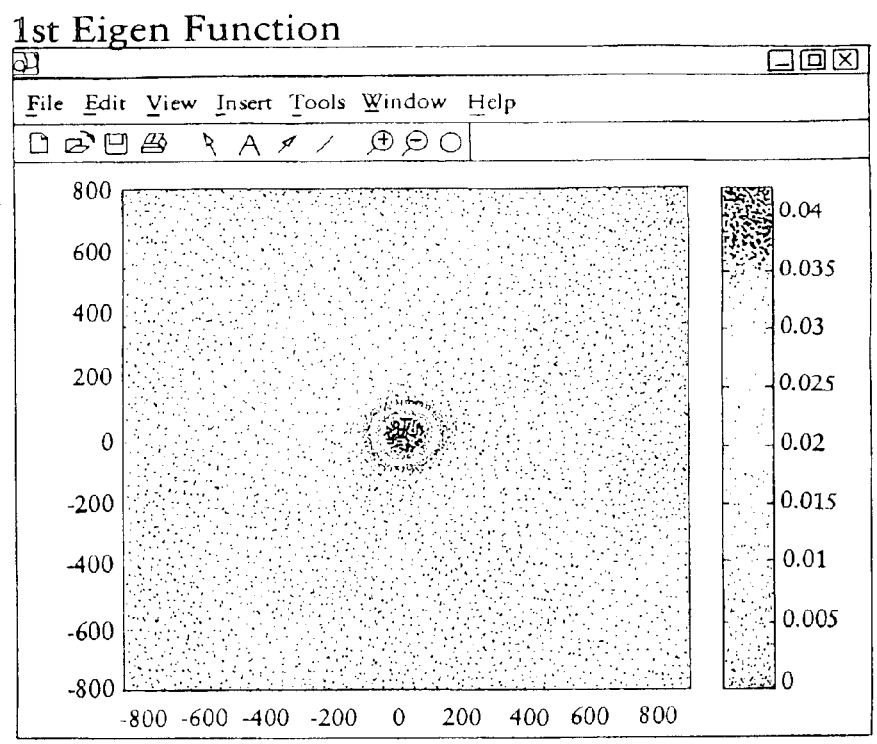
Figure 10B:
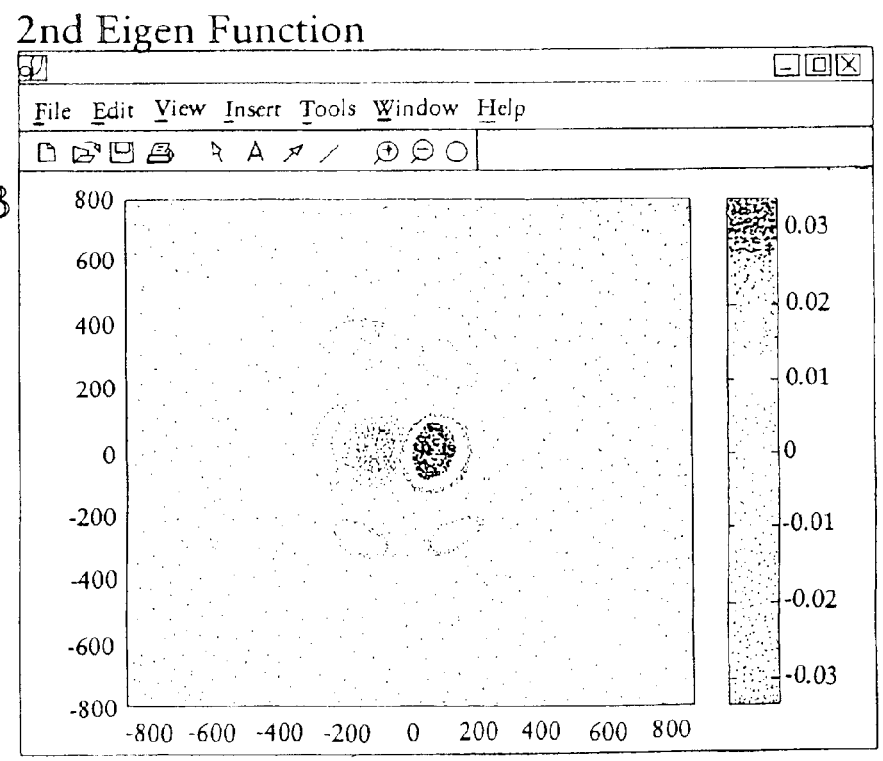

FIGS. 9 and 10 illustrates an exemplary images derived using four eigen functions using constant threshold eigen decomposition model of the present invention. FIG. 9 illustrates a Quasar illumination pupil as an illumination source. FIG. 10 illustrates the first, second, third and fourth corresponding eigen functions which are estimated. Higher order eigen functions can be derived using the method.

Figure 19A:
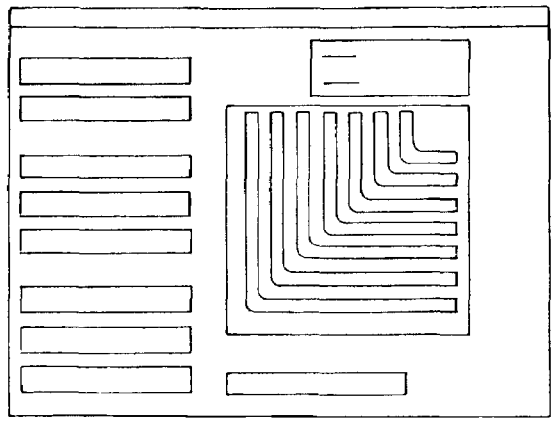
Figure 19B:
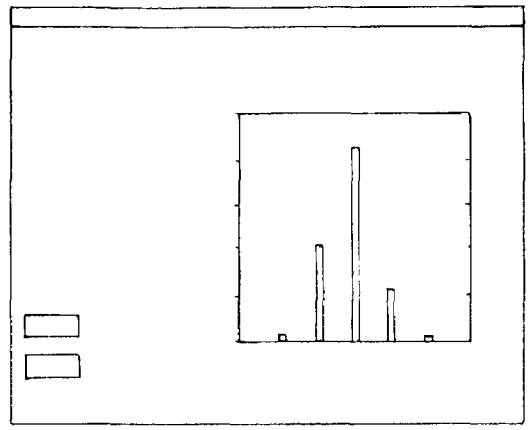
Figure 20A:
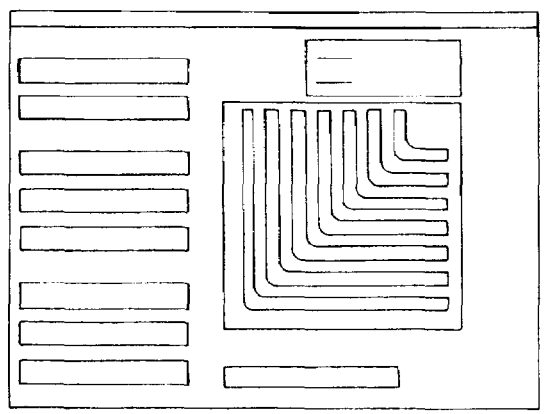
Figure 20B:
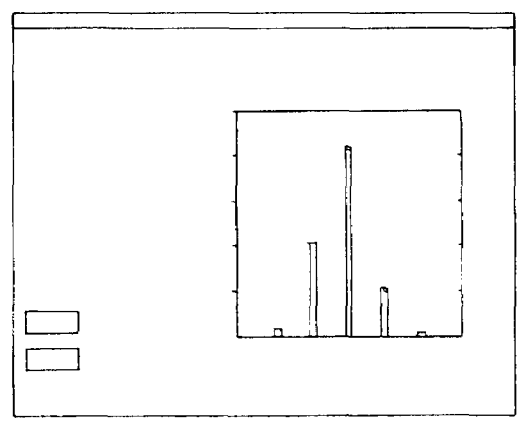

FIGS. 18-20B illustrate an implementation of the model of the present invention with an exemplary mask pattern with Quasar illumination and 248 nm exposure light. A plurality of images were obtained and the calibration result and error statistics of the first and eighth images are illustrated in FIGS. 19 and 20. Note that the error is pixel size limited. The error is calculated along the feature edge, pixel by pixel. Since a CD measurement widow is always defined during a CD measurement, and there are usually considerable number of pixels in the measurement window, therefore, the CD error distribution is significantly narrower.

The implementation method proposed here and the optimal eigen functions are referred to the design for precision model OPC. However, this method is not limited to precision model OPC application. This method can be extended to a wide range of applications in lithography, for example, but not limited to, the generation of interference map for automatic placement of assist OPC features, such as non-printed features and anti-Scattering Bars, etc.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for modeling a photolithography process comprising the steps of:
   receiving parameters indicative of a target pattern and characteristics of a partially coherent imaging system utilized to image said target pattern;
   decomposing said partially coherent imaging system into a series of coherent imaging systems, said series of coherent imaging systems being defined utilizing a plurality of eigen functions;
   determining an aerial image intensity distribution expected to be produced on a resist by the target pattern using said plurality of eigen functions and a function representing said target pattern; and
   determining an imaging model based on the aerial image, wherein said imaging model comprises a system pseudo intensity function (SPIF), said method further comprising the steps of:
   applying a constant threshold to the SPIF to generate contours;
   comparing the generated contours with expected contours; and
   adjusting weights of each term associated with each eigen function and generating a new SPIF if the generated contours are not within a predetermined tolerance of the expected contours.

2. The method of claim 1, wherein the steps of applying a constant threshold to the SPIF, comparing the generated contours and adjusting weights of each term associated with each eigen function are repeated a predetermined number of times or until the generated contours are within a predetermined tolerance of the expected contours.

3. The method of claim 2, wherein the constant threshold is the same constant threshold for each SPIF.

4. The method of claim 2, wherein the constant threshold is a variable threshold which changes for each SPIF.

5. The method of claim 1, wherein the step of determining an aerial image utilizes a vector characterization of a light wave.

6. The method of claim 5, wherein the imaging system has a numerical aperture greater than or equal to 0.7.

7. The method of claim 1, wherein the step of determining an aerial image utilizes a pupil function indicative of characteristics of the optical imaging system.

8. The method of claim 7, wherein the pupil function is produced by the function:

$$K_{ij}(\alpha', \beta', z') = \sum_{k=x,y,z} \sqrt{\frac{\gamma}{\gamma'}} G_{ik}(\alpha', \beta', z')$$

$$Q_{kj}(\alpha', \beta')e^{i\frac{2\pi}{\lambda}[W(\alpha',\beta')+\gamma'\Delta]}$$

where ($\alpha'$, $\beta'$) are angular coordinates in an exit pupil, $z'$ is a plane position in a resist relative to an air/resist interface, W ($\alpha'$, $\beta'$) is an aberration function, $\Delta$ is a defocus, N is a reduction factor in imaging system, $Q_{kj}$ ($\alpha'$, $\beta'$) accounts for the light polarization conversion from j component in the object space into k component into the image space, $G_{ik}$ ($\alpha'$, $\beta'$; $z'$) accounts for the effect of light interference in the film stacks; and $$\gamma' = \sqrt{1-\alpha'^2-\beta'^2}$$

$$\gamma = \sqrt{1-(\alpha'^2+\beta'^2)/N^2}.$$

9. The method of claim 8, wherein the step of determining the aerial image includes the step of determining a light intensity distribution at a plane z using eigen vector decomposition.

10. The method of claim 9, wherein the step of determining the aerial image further includes the step of determining a z-averaged light intensity distribution.

11. The method of claim 10, wherein the z-averaged light intensity distribution is determined according to the function:

$$<\overline{I(x,y)}> = \sum_{n=1} \chi_n \left| \int\int \Phi_n(f,g) \mathcal{F}(f,g) e^{2\pi i [fx+gy]} df dg \right|^2.$$

12. A computer readable storage device containing instructions, which when executed by a computer, enables the computer to perform a method for modeling a photolithography process comprising the steps of:
   receiving parameters indicative of a target pattern and characteristics of a partially coherent imaging system utilized to image said target pattern;

decomposing said partially coherent imaging system into a series of coherent imaging systems, said series of coherent imaging systems being defined utilizing a plurality of eigen functions;

determining an aerial image intensity distribution expected to be produced on a resist by the target pattern using said plurality of eigen functions and a function representing said target pattern; and determining an imaging model based on the aerial image, wherein said imaging model comprises a system pseudo intensity function (SPIF), said computer readable medium further containing instructions to enable the computer to perform the steps of:

applying a constant threshold to the SPIF to generate contours;

comparing the generated contours with expected contours; and adjusting weights of each term associated with each eigen function and generating a new SPIF if the generated contours are not within a predetermined tolerance of the expected contours.

13. The computer readable storage device of claim 12, wherein the instructions enable the computer to perform the steps of applying a constant threshold to the SPIF, comparing the generated contours and adjusting weights of each term associated with each eigen function to be repeated a predetermined number of times or until the generated contours are within a predetermined tolerance of the expected contours.

14. The computer readable storage device of claim 13, wherein the constant threshold is the same constant threshold for each SPIF.

15. The computer readable storage device of claim 13, wherein the constant threshold is a variable threshold which changes for each SPIF.

16. The computer readable storage device of claim 12, wherein the step of determining an aerial image utilizes a vector characterization of a light wave.

17. The computer readable storage device of claim 16, wherein the imaging system has a numerical aperture greater than or equal to 0.7.

18. The computer readable storage device of claim 12, wherein the step of determining an aerial image utilizes a pupil function indicative of characteristics of the optical imaging system.

19. The computer readable storage device of claim 18, wherein the pupil function is produced by the function:

$$K_{ij}(\alpha', \beta', z') = \sum_{k=x,y,z} \sqrt{\frac{\gamma}{\gamma'}} G_{ik}(\alpha', \beta', z')$$

$$Q_{kj}(\alpha', \beta') e^{i\frac{2\pi}{\lambda}[W(\alpha', \beta') + \gamma'\Delta]}$$

where ($\alpha'$, $\beta'$) are angular coordinates in an exit pupil, z' is a plane position in a resist relative to an air/resist interface, W ($\alpha'$, $\beta'$) is an aberration function, $\Delta$ is a defocus, N is a reduction factor in imaging system, $Q_{kj}$ ($\alpha'$, $\beta'$) accounts for the light polarization conversion from j component in the object space into k component into the image space, $G_{ik}$ ($\alpha'$, $\beta'$; z') accounts for the effect of light interference in the film stacks; and $$\gamma' = \sqrt{1 - \alpha'^2 - \beta'^2}$$

$$\gamma = \sqrt{1 - (\alpha'^2 + \beta'^2)/N^2}.$$

20. The computer readable storage device of claim 19, wherein the step of determining the aerial image includes the step of determines a light intensity distribution at a plane z using eigen vector decomposition.

21. The computer readable storage device of claim 20, wherein the step of determining the aerial image further includes the step of determining a z-averaged light intensity distribution.

22. The computer readable storage device of claim 21, wherein the z-averaged light intensity distribution is determined according to the function:

$$<\overline{I(x, y)}> = \sum_{n=1} \chi_n \left| \int \int \Phi_n(f, g) \mathcal{F}(f, g) e^{2\pi i [fx + gy]} df dg \right|^2.$$

* * * * *